(12) United States Patent
Nakanuma

(10) Patent No.: US 10,644,215 B2
(45) Date of Patent: May 5, 2020

(54) THERMOELECTRIC GENERATOR

(71) Applicant: Tadashi Nakanuma, Shiga (JP)

(72) Inventor: Tadashi Nakanuma, Shiga (JP)

(*) Notice: Subject to any disclaimer, the term of this patent is extended or adjusted under 35 U.S.C. 154(b) by 896 days.

(21) Appl. No.: 14/364,350

(22) PCT Filed: Dec. 26, 2012

(86) PCT No.: PCT/JP2012/083650
§ 371 (c)(1),
(2) Date: Jun. 11, 2014

(87) PCT Pub. No.: WO2013/099943
PCT Pub. Date: Jul. 4, 2013

(65) Prior Publication Data
US 2014/0338713 A1 Nov. 20, 2014

(30) Foreign Application Priority Data

Dec. 26, 2011 (JP) .................... 2011-283769
Jun. 7, 2012 (WO) .................. PCT/JP2012/064637

(51) Int. Cl.
*H01L 35/28* (2006.01)
*H01L 35/30* (2006.01)
(Continued)

(52) U.S. Cl.
CPC .............. *H01L 35/28* (2013.01); *F28D 20/02* (2013.01); *H01L 35/30* (2013.01);
(Continued)

(58) Field of Classification Search
CPC ......... H01L 35/00; H01L 35/16; H01L 35/28; H01L 35/30; H01L 35/32; H01L 35/34;
(Continued)

(56) References Cited

U.S. PATENT DOCUMENTS 5,671,909 A    9/1997  Hamada et al.
5,867,990 A *  2/1999  Ghoshal .................. F25B 21/02
                                                  165/185
(Continued)

FOREIGN PATENT DOCUMENTS

DE    102007017461    10/2008
DE    102010007420    8/2011
(Continued)

OTHER PUBLICATIONS

European Search Report in counterpart European application No. 16175967.5-1555, dated Oct. 14, 2016.
(Continued)

*Primary Examiner* — Mayla Gonzalez Ramos
(74) *Attorney, Agent, or Firm* — Kirschstein, Israel, Schiffmiller & Pieroni, P.C.

(57) ABSTRACT

A thermoelectric generator has a heat conducting body that exchanges heat with the environment according to environmental temperature changes, a heat storing body, and a thermoelectric conversion unit and thermal resistance body arranged between the heat conducting body and the heat storing body. One end of the thermal resistance body and one end of the thermoelectric conversion unit are in contact with each other. The other end of the thermal resistance body is in contact with the heat conducting body, and the other end of the thermoelectric conversion unit is in contact with the heat storing body. The surface of the heat storing body is covered by a covering layer having certain heat insulation properties. The temperature difference generated between the heat conducting body and the heat storing body is utilized to extract electric energy from the thermoelectric conversion unit.

7 Claims, 21 Drawing Sheets

(51) Int. Cl.
*F28D 20/02* (2006.01)
*F28F 13/00* (2006.01)

(52) U.S. Cl.
CPC ......... *F28F 2013/008* (2013.01); *Y02B 10/20* (2013.01); *Y02E 60/145* (2013.01)

(58) Field of Classification Search
CPC ....... F28D 20/02; Y02B 10/20; Y02E 60/145; F28F 2013/008
See application file for complete search history.

(56) References Cited

U.S. PATENT DOCUMENTS

| | | | |
|---|---|---|---|
| 2006/0208492 A1 | 9/2006 | Jovanovic | |
| 2008/0257395 A1* | 10/2008 | Jovanovic | H01L 29/155 136/239 |
| 2010/0198204 A1* | 8/2010 | Rogers | A61F 7/007 606/21 |
| 2012/0073620 A1* | 3/2012 | Bohl | H01L 35/32 136/224 |
| 2012/0152297 A1* | 6/2012 | Mitchell | H01L 35/30 136/205 |
| 2012/0234526 A1* | 9/2012 | Yuan | F25B 21/04 165/277 |

FOREIGN PATENT DOCUMENTS

| | | |
|---|---|---|
| EP | 2475019 | 7/2012 |
| JP | 11284235 | 10/1999 |
| JP | 2004047635 | 2/2004 |
| JP | 2005347348 | 12/2005 |
| JP | 2009247049 | 10/2009 |
| JP | 2010045881 | 2/2010 |

OTHER PUBLICATIONS

D. Samson, Aircraft-Specific Thermoelectric Generator Module, Journal of Electronic Materials, vol. 39, No. 9, Sep. 1, 2010.

* cited by examiner

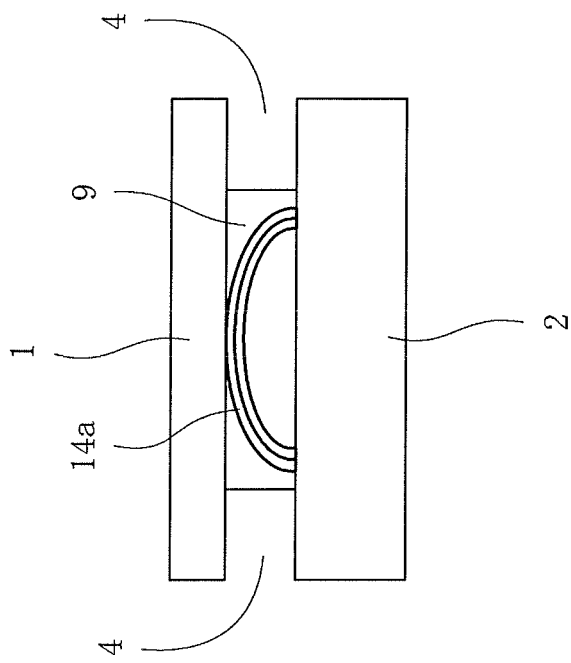
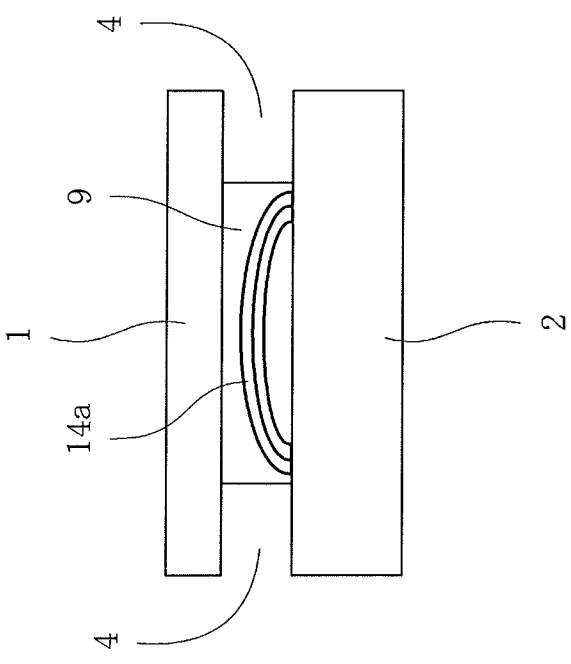

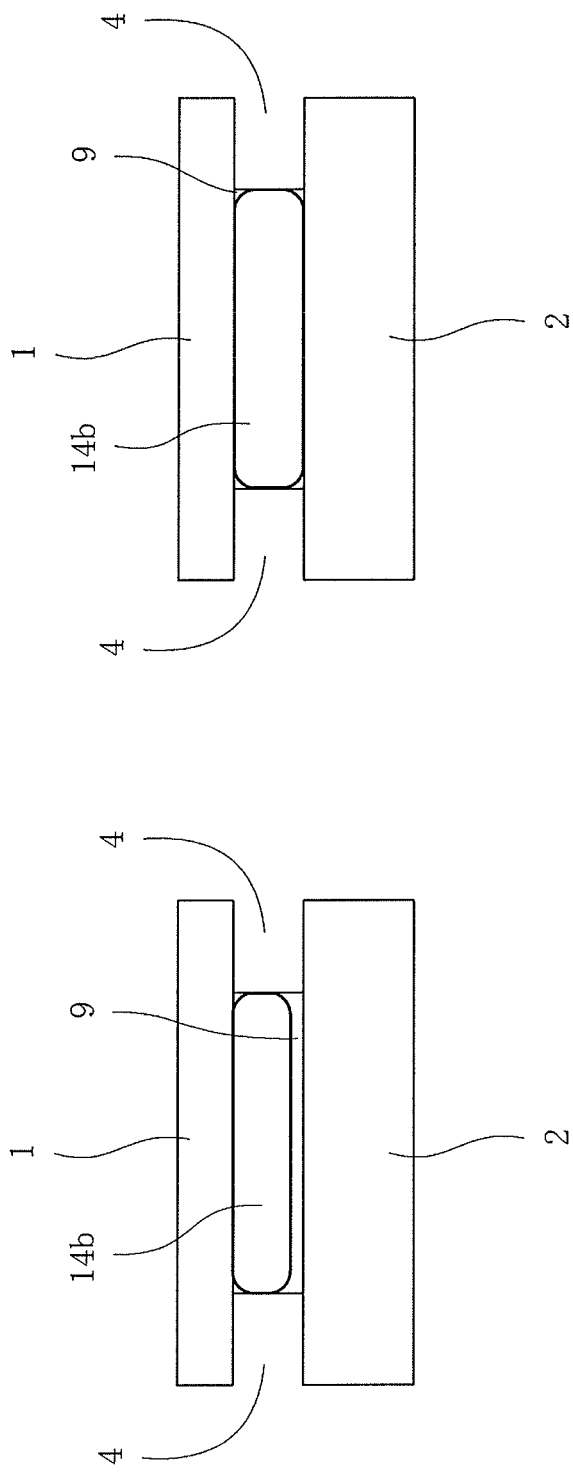

THERMOELECTRIC GENERATOR

TECHNICAL FIELD

The present invention relates to a thermoelectric generator which generates electricity by utilizing change of temperature of external environment so as to convert thermal energy into electric energy.

BACKGROUND ART

Energy harvesting has received attention in recent years. The energy harvesting is a technology of converting environmental energy such as heat, vibration, light and electromagnetic wave into electric power. As a technology concerning the energy harvesting, there exist in the prior art some thermoelectric generators of generating electric power from thermal energy by means of thermoelectric conversion module (See, Patent Documents 1-3).

According to the conventional thermoelectric generators, on electric power generation, it is necessary to cause a certain amount of temperature difference between both sides of the thermoelectric conversion module by supplying heat to one side thereof by means of a source of heating and releasing heat from the other side thereof by means of a source of cooling. Namely, in the conventional thermoelectric generators, an installation site of the thermoelectric generator is restricted because temperature difference between the source of heating and the source of cooling which are located adjacent to each other is used for electric power generation.

On the other hand, in micropower electronics such as a wireless sensor, a remote monitor and so on, for convenience of maintenance, it is desirable to use environmental energy as a power source instead of commercial power supply or a battery. Therefore, it may be suggested to incorporate the above-mentioned thermoelectric generator as a power source to those micropower electronics. However, there arises a problem that the micropower electronics cannot be freely installed at a place where they are required because of the above-mentioned restriction of installation site of the thermoelectric generators.

A solar cell converting solar light to electricity is also well known as a technology utilizing environmental energy in the prior art. However, according to the solar cell, the electric power generation cannot be conducted after dark, and the production of electricity is not stabilized because sunshine is significantly affected by weather and clouds, so that an electric storage device is required. Consequently, the solar cell is only used as an auxiliary power unit.

PRIOR ART DOCUMENTS

Patent Documents

Patent Document 1: JP 2004-47635 A
Patent Document 2: JP 2005-347348 A
Patent Document 3: JP 2010-45881 A

SUMMARY OF THE INVENTION

Problems to be Solved by the Invention

It is an object of the present invention to provide a thermoelectric generator stably generating electricity without the need to supply heat to one side of a thermoelectric conversion module through heating and release heat from the other side of the module through cooling so as to cause temperature difference between the both sides of the thermoelectric conversion module.

Means for Solving the Problems

In order to achieve the object, the present invention provides a thermoelectric generator arranged in an environment so as to generate electricity by using change of temperature of the environment, the temperature of the environment being increased and decreased repeatedly, the thermoelectric generator comprising: at least one heat conductor contacting with the environment to conduct thermal exchange with the environment; at least one heat accumulator; at least one thermoelectric conversion unit arranged between at least one pair selected from a group which consists of a pair of the heat conductor and the heat accumulator, and a pair of the heat accumulators; at least one thermal flow control unit arranged between at least one pair selected from a group which consists of a pair of the thermal conductor and the thermal accumulator, a pair of the thermal accumulators, a pair of the thermal conductor and the thermoelectric conversion unit, and a pair of the thermal accumulator and the thermoelectric conversion unit, the thermal flow control unit controlling heat transfer between the selected pair(s); and a covering layer having a thermal insulating property and covering the at least one thermal accumulator, wherein electric energy is generated from the thermoelectric conversion unit by temperature difference caused between the thermal conductor and the thermal accumulator or between the thermal accumulators or both. Here, the term "environment" includes, for example, the inside of outdoor air whose temperature is periodically changed during day and night, the neighborhood or surface of mechanical appliances which are arranged indoor and change temperature thereof according to operating condition and so on. Further, the covering layer has a thermal insulating property, that is, a certain amount of thermal resistance, where the thermal resistance of the covering layer is sufficiently high (order of magnitude) compared to the total thermal resistance of a thermal network composed of the thermal conductor, the thermoelectric conversion unit, the thermal flow control unit and the thermal accumulator.

According to a preferred embodiment of the present invention, the thermoelectric generator comprises the single thermal conductor, the single thermal accumulator and at least one pair of the thermoelectric conversion unit and the thermal flow control unit, the pair of the thermoelectric conversion unit and the thermal flow control unit being arranged between the thermal conductor and the thermal accumulator. The thermal flow control unit is a thermal resistor, and the thermal resistor and the associated thermoelectric conversion unit contact with each other at one sides thereof. The other side of one of the pair of the thermal resistor and the associated thermoelectric conversion unit contacts with the thermal conductor, while the other side of the other of the pair of the thermal resistor and the associated thermoelectric conversion unit contacts with the thermal accumulator. The thermal accumulator is covered by the covering layer except the area thereof contacting with the thermoelectric conversion unit and the thermal resistor Thus electric energy is generated from the thermoelectric conversion unit by the temperature difference caused between the thermal conductor and the thermal accumulator. In this case, the thermal resister may be incorporated into the thermoelectric conversion unit or the thermoelectric conversion unit has thermal resistance value corresponding to thermal resistance value of the thermal resister.

According to another preferred embodiment of the present invention, the thermoelectric generator comprises the single thermal conductor, the single thermal accumulator and at least one of the thermoelectric conversion units and at least one of the thermal flow control units, each of the thermoelectric conversion unit and the thermal flow control unit being arranged between the thermal conductor and the thermal accumulator. The thermoelectric conversion unit contacts with the thermal conductor at one side thereof and contacts with the thermal accumulator at the other side thereof. The thermal flow control unit is an auxiliary thermal conduction unit thermally expanding and contracting or thermally deforming so as to move between a first position in which the auxiliary thermal conduction unit contacts with both the thermal conductor and the thermal accumulator to effect the heat transfer between the thermal conductor and the thermal accumulator through the auxiliary thermal conduction unit and a second position in which the auxiliary thermal conduction unit separates from at least one of the pair of the thermal conductor and the thermal accumulator to stop the heat transfer. The thermal accumulator is covered by the covering layer except the area thereof contacting with the thermoelectric conversion unit and the auxiliary thermal conduction unit. The auxiliary thermal conduction unit is located at the first position when the temperature of the thermal conductor is in the vicinity of the highest temperature thereof or the lowest temperature thereof. Thus electric energy is generated from the thermoelectric conversion unit by the temperature difference caused between the thermal conductor and the thermal accumulator.

According to a further preferred embodiment of the present invention, the thermoelectric generator comprises the single thermal conductor, the single thermal accumulator, at least one of the thermoelectric conversion units and at least one of the thermal flow control units, each of the thermoelectric conversion unit and the thermal flow control unit being arranged between the thermal conductor and the thermal accumulator. The thermoelectric conversion unit contacts with the thermal conductor at one side thereof and contacts with the thermal accumulator at the other side thereof. The thermal flow control unit is a thermal flow switch moving between an ON-position in which the thermal flow switch contacts with both the thermal conductor and the thermal accumulator to effect heat transfer between the thermal conductor and the thermal accumulator through the thermal flow switch and an OFF-position in which the thermal flow switch separates from at least one of the pair of the thermal conductor and the thermal accumulator to stop the heat transfer. The thermal accumulator is covered by the covering layer except the area thereof contacting with the thermoelectric conversion unit and the thermal flow switch. The thermoelectric generator further comprises: a first temperature sensor detecting temperature of the thermal conductor; a second temperature sensor detecting temperature of the thermal accumulator; and a thermal flow switch controller switching the ON-position and the OFF-position of the thermal flow switch based on detection signals of the first and second temperature sensors. Electric energy is generated from the thermoelectric conversion unit by the temperature difference caused between the thermal conductor and the thermal accumulator.

According to a further preferred embodiment of the present invention, the thermoelectric generator comprises the single thermal conductor, the single thermal accumulator, and at least one pair of the thermoelectric conversion unit and the thermal flow control unit, the pair of the thermoelectric conversion unit and the thermal flow control unit being arranged between the thermal conductor and the thermal accumulator. The thermal flow control unit and the associated thermoelectric conversion unit contact with each other at one sides thereof. The other side of one of the pair of the thermal flow control unit and the associated thermoelectric conversion unit contacts with the thermal conductor, while the other side of the other of the pair of the thermal flow control unit and the associated thermoelectric conversion unit contacts with the thermal accumulator. The thermal accumulator is covered by the covering layer except the area thereof contacting with the thermoelectric conversion unit and the thermal flow control unit. The thermal flow control unit is a thermal flow switch moving between an ON-position in which the thermal flow switch contacts with both the thermal conductor and the thermoelectric conversion unit or both the thermoelectric conversion unit and the thermal accumulator to effect heat transfer between the thermal conductor and the thermal accumulator through the thermal flow switch and an OFF-position in which the thermal flow switch separates from at least one of the pair of the thermal conductor and the thermoelectric conversion unit or at least one of the pair of the thermoelectric conversion unit and the thermal accumulator to stop the heat transfer. The thermoelectric generator further comprises: a first temperature sensor detecting temperature of the thermal conductor; a second temperature sensor detecting temperature of the thermal accumulator; and a thermal flow switch controller switching the ON-position and the OFF-position of the thermal flow switch based on detection signals of the first and second temperature sensors. Electric energy is generated from the thermoelectric conversion unit by the temperature difference caused between the thermal conductor and the thermal accumulator. According to a further preferred embodiment of the present invention, the thermal conductor, the thermal flow control unit and the thermoelectric conversion unit are detachable for exchanging new ones, which provides easy maintenance of the thermoelectric generator and quick correspondence to future improvement for upgrade of the thermoelectric generator.

According to a further preferred embodiment of the present invention, the thermoelectric generator comprises the single thermal conductor; the first and second thermal accumulators; at least one of the thermoelectric conversion units arranged between the first and second thermal accumulators in such a way that the thermoelectric conversion unit contacts with the first thermal accumulator at one side thereof and the second thermal accumulator at the other side thereof; at least one of the first thermal flow control units arranged between the first thermal accumulator and the thermal conductor; and at least one of the second thermal flow control units arranged between the second thermal accumulator and the thermal conductor. The first thermal flow control unit is a first thermal flow switch arranged between the thermal conductor and the first thermal accumulator to move between an ON-position in which the first thermal flow switch contacts with both the thermal conductor and the first thermal accumulator to effect heat transfer between the thermal conductor and the first thermal accumulator through the first thermal flow switch and an OFF-position in which the first thermal flow switch separates from at least one of the pair of the thermal conductor and the first thermal accumulator to stop the heat transfer. The second thermal flow control unit is a second thermal flow switch arranged between the thermal conductor and the second thermal accumulator to move between an ON-position in which the second thermal flow switch contacts with both the thermal conductor and the second thermal accumulator to effect heat transfer between the thermal conductor and the second thermal accumulator through the second thermal flow switch and an OFF-position in which the second thermal flow switch separates from at least one of the pair of the thermal conductor and the second thermal accumulator to stop the heat transfer. The first thermal accumulator is covered by the covering layer except the area thereof contacting with the first thermal flow switch and the thermoelectric conversion unit, and the second thermal accumulator is covered by the covering layer except the area thereof contacting with the second thermal flow switch and the thermoelectric conversion unit. The thermoelectric generator further comprises: a first temperature sensor detecting temperature of the thermal conductor; a second temperature sensor detecting temperature of the first thermal accumulator; a third temperature sensor detecting temperature of the second thermal accumulator; and a thermal flow switch controller switching the ON-positions and the OFF-positions of the first and second thermal flow switches based on detection signals of the first through third temperature sensors. Electric energy is generated from the thermoelectric conversion unit by the temperature difference caused between the first and second thermal accumulators.

According to a further preferred embodiment of the present invention, the thermoelectric generator further comprises: a first Peltier element arranged between the first thermal flow switch and the first thermal accumulator in such a way that the first Peltier element contacts with the first thermal flow switch at one side thereof and the first thermal accumulator at the other side thereof; and a second Peltier element arranged between the second thermal flow switch and the second thermal accumulator in such a way that the second Peltier element contacts with the second thermal flow switch at one side thereof and the second thermal accumulator at the other side thereof. The first Peltier element absorbs heat at the one side thereof and generates heat at the other side thereof when the first thermal flow switch is located at the ON-position. The second Peltier element generates heat at the one side thereof and absorbs heat at the other side thereof when the second thermal flow switch is located at the ON-position. According to a further preferred embodiment of the present invention, the thermal conductor covers the whole of surface of the covering layer. According to a further preferred embodiment of the present invention, at least one of the thermal accumulators is formed of a plurality of latent heat storage means having different phase transition temperatures, respectively.

According to a further preferred embodiment of the present invention, the thermoelectric generator comprises: the single thermal conductor; the first and second thermal accumulators, the second thermal accumulator being a construction at which the thermoelectric generator is arranged; at least one of the thermal flow control units arranged between the thermal conductor and the first thermal accumulator in such a way that the thermal flow control unit contacts with the thermal conductor at one side thereof and the first thermal accumulator at the other side thereof. The thermal flow control unit is a thermal flow switch moving between an ON-position in which the thermal flow switch contacts with both the thermal conductor and the first thermal accumulator to effect heat transfer between the thermal conductor and the first thermal accumulator through the thermal flow switch and an OFF-position in which the thermal flow switch separates from at least one of the pair of the thermal conductor and the first thermal accumulator to stop the heat transfer. The thermoelectric generator further comprises: at least one of the thermoelectric conversion units arranged between the first thermal accumulator and the construction in such a way that the thermoelectric conversion unit contacts with the first thermal accumulator at one side thereof and the construction at the other side thereof, the first thermal accumulator being covered by the covering layer except the area thereof contacting with the thermal flow switch and the thermoelectric conversion unit; a first temperature sensor detecting temperature of the thermal conductor; a second temperature sensor detecting temperature of the first thermal accumulator; a third temperature sensor detecting temperature of the construction; and a thermal flow switch controller switching the ON-positions and the OFF-positions of the thermal flow switches based on detection signals of the first through third temperature sensors. Electric energy is generated from the thermoelectric conversion unit by the temperature difference caused between the first thermal accumulator and the construction. In this case, the construction is, for example, a mechanical appliance or a building or a buoy floating on the sea, a river and a lake or a heat-exchange equipment exchanging heat with the ground having almost constant temperature throughout the year.

According to a further preferred embodiment of the present invention, the thermoelectric generator further comprises: a first additional thermal accumulator; a second additional thermal accumulator; at least one additional thermoelectric conversion unit arranged between the first and second additional thermal accumulators in such a way that the additional thermoelectric conversion unit contacts with the first additional thermal accumulator at one side thereof and the second additional thermal accumulator at the other side thereof; at least one additional Peltier element arranged between the first and second additional thermal accumulator in such a way that the additional Peltier element contacts with the first additional accumulator at one side thereof and the second additional thermal accumulator at the other side thereof; and an additional covering layer having a thermal insulating property and covering the first and second additional thermal accumulators except the areas thereof contacting the additional thermoelectric conversion unit and the additional Peltier element. Electric energy outputted by the thermoelectric conversion unit(s) except the additional thermoelectric conversion unit is converted to thermal energy by the additional Peltier element so as to effect temperature difference between the first and second additional thermal accumulators, and electric energy is generated from the additional thermoelectric conversion unit by the temperature difference between the first and second additional thermal accumulators. In this embodiment, when an electronic device, which receives electricity supply from the thermoelectric generator, operates intermittently and accordingly, intermittent output of electricity from the thermoelectric generator is permitted, the additional Peltier element may be removed and the additional thermoelectric conversion unit may be composed of a Seebeck element. In this case, the additional thermoelectric conversion unit functions as the Seebeck element when the electricity is outputted from the thermoelectric generator, and the additional thermoelectric conversion unit functions as a Peltier element when the electricity is not outputted from the thermoelectric generator.

According to a further preferred embodiment of the present invention, the thermoelectric generator further comprises: a first additional thermal accumulator; a second additional thermal accumulator; at least one additional thermoelectric conversion unit arranged between the first and second additional thermal accumulators in such a way that the additional thermoelectric conversion unit contacts with the first additional thermal accumulator at one side thereof and the second additional thermal accumulator at the other side thereof; an additional covering layer having a thermal insulating property and covering the first and second additional thermal accumulators except the areas thereof contacting with the additional thermoelectric conversion unit; and a heater arranged in the additional covering layer to contact with the first additional thermal accumulator. Electric energy outputted by the thermoelectric conversion unit(s) except the additional thermoelectric conversion unit is converted to thermal energy by the heater so as to heat the first additional thermal accumulator, and electric energy is generated from the additional thermoelectric conversion unit by the temperature difference caused between the first and second additional thermal accumulators.

According to a further preferred embodiment of the present invention, the thermoelectric generator further comprises: a first additional thermal accumulator; a second additional thermal accumulator; at least one additional thermoelectric conversion unit arranged between the first and second additional thermal accumulators in such a way that the additional thermoelectric conversion unit contacts with the first additional thermal accumulator at one side thereof and the second additional thermal accumulator at the other side thereof; at least one additional Peltier element arranged between the first and second additional thermal accumulators in such a way that the additional Peltier element contacts with the first additional thermal accumulator at one side thereof and the second additional thermal accumulator at the other side thereof, the second additional thermal accumulator being a construction at which the thermoelectric generator is arranged; and an additional covering layer having a thermal insulating property and covering the first additional thermal accumulator except the area thereof contacting with the additional thermoelectric conversion unit and the additional Peltier element. Electric energy outputted by the thermoelectric conversion unit(s) except the additional thermoelectric conversion unit is converted to thermal energy by the additional Peltier element so as to effect temperature difference between the first and second additional thermal accumulators, and electric energy is generated from the additional thermoelectric conversion unit by the temperature difference between the first and second additional thermal accumulators. In this embodiment, when an electronic device, which receives electricity supply from the thermoelectric generator, operates intermittently and accordingly, intermittent output of electricity from the thermoelectric generator is permitted, the additional Peltier element may be removed and the additional thermoelectric conversion unit may be composed of a Seebeck element. In this case, the additional thermoelectric conversion unit functions as the Seebeck element when the electricity is outputted from the thermoelectric generator, and the additional thermoelectric conversion unit functions as a Peltier element when the electricity is not outputted from the thermoelectric generator.

According to a further preferred embodiment of the present invention, the thermoelectric generator further comprises: a first additional thermal accumulator; a second additional thermal accumulator; at least one additional thermoelectric conversion unit arranged between the first and second additional thermal accumulators in such a way that the additional thermoelectric conversion unit contacts with the first additional thermal accumulator at one side thereof and the second additional thermal accumulator at the other side thereof; an additional covering layer having a thermal insulating property and covering the first and second additional thermal accumulators except the areas thereof contacting with the additional thermoelectric conversion unit; and a heater arranged in the additional covering layer to contact with the first additional thermal accumulator. The second additional thermal accumulator is a construction at which the thermoelectric generator is arranged. Electric energy outputted by the thermoelectric conversion unit(s) except the additional thermoelectric conversion unit is converted to thermal energy by the heater so as to heat the first additional thermal accumulator, and electric energy is generated from the additional thermoelectric conversion unit by the temperature difference caused between the first additional thermal accumulator and the construction.

According to a further preferred embodiment of the present invention, the environment is the inside of outdoor air, and the thermoelectric generator further comprises: the first and second thermal conductors; the first and second thermal accumulators; at least one of the first thermal flow control units arranged between the first thermal conductor and the first thermal accumulator; at least one of the second thermal flow control units arranged between the second thermal conductor and the second thermal accumulator. The first thermal flow control unit is a first thermal flow switch moving between an ON-position in which the first thermal flow switch contacts with both the first thermal conductor and the first thermal accumulator to effect heat transfer between the first thermal conductor and the first thermal accumulator through the first thermal flow switch and an OFF-position in which the first thermal flow switch separates from at least one of the pair of the first thermal conductor and the first thermal accumulator to stop the heat transfer. The second thermal flow control unit is a second thermal flow switch moving between an ON-position in which the second thermal flow switch contacts with both the second thermal conductor and the second thermal accumulator to effect heat transfer between the second thermal conductor and the second thermal accumulator through the second thermal flow switch and an OFF-position in which the second thermal flow switch separates from at least one of the pair of the second thermal conductor and the second thermal accumulator to stop the heat transfer. The thermoelectric generator further comprises at least one of the thermoelectric conversion unit arranged between the first and second thermal accumulators in such a way that the thermoelectric conversion unit contacts with the first thermal accumulator at one side thereof and the second thermal accumulator at the other side thereof. The first and second thermal accumulators being covered by the covering layer except the areas thereof contacting with the first and second thermal flow switches and the thermoelectric conversion unit. A filter is arranged over and overlapped with a heat exchange surface of the first thermal conductor facing the environment so as to transmit solar light except far-infrared radiation, and another filter is arranged over and overlapped with a heat exchange surface of the second thermal conductor facing the environment so as to block solar light except far-infrared radiation. The thermoelectric generator further comprises: a first temperature sensor detecting temperature of the first thermal conductor; a second temperature sensor detecting temperature of the first thermal accumulator; a third temperature sensor detecting temperature of the second thermal conductor; a fourth temperature sensor detecting the second thermal accumulator; and a thermal flow switch controller switching the ON-positions and the OFF-positions of the first and second thermal flow switches based on detection signals of the first through fourth temperature sensors. Thus electric energy is generated from the thermoelectric conversion unit by the temperature difference caused between the first and second thermal accumulators.

Effect of the Invention

According to the present invention, the thermal conductor contacts with the environment whose temperature increases and decreases repeatedly so as to exchange heat with the environment, and the thermal flow control unit is arranged between at least one pair selected from a group which consists of the pair of the thermal conductor and the thermal accumulator, the pair of the thermal accumulators, the pair of the thermal conductor and the thermoelectric conversion unit, and the pair of the thermal accumulator and the thermoelectric conversion unit so as to control heat transfer between the selected pair(s). Consequently, temperature difference is automatically caused between the thermal conductor and the thermal accumulator, or the thermal accumulators, and electric voltage is generated from the thermoelectric conversion unit in proportion to the temperature difference.

According to the embodiment wherein the thermoelectric generator comprising the single thermal conductor, the single thermal accumulator, and at least one pair of the thermoelectric conversion unit and the thermal flow control unit which is arranged between the thermal conductor and the thermal accumulator, wherein the thermal flow control unit and the associated thermoelectric conversion unit contact with each other at one sides thereof, and the other side of one of the pair of the thermal flow control unit and the associated thermoelectric conversion unit contacts with the thermal conductor, while the other side of the other of the pair of the thermal flow control unit and the associated thermoelectric conversion unit contacts with the thermal accumulator, wherein the thermal flow control unit is the thermal resistor, and the thermal accumulator is covered by the covering layer except the area thereof contacting with the thermoelectric conversion unit and the thermal resistor. Thus the temperature of the thermal accumulator is maintained near intermediate temperature between the highest and lowest temperatures of the thermal conductor due to a thermal time constant determined by the total thermal resistance of a thermal network composed of the thermal conductor, the thermal resistance (the thermal flow control unit), the thermoelectric conversion unit and the thermal accumulator, and a thermal capacity of the thermal accumulator, so that temperature difference is automatically caused between the thermal conductor and the thermal accumulator, and electric voltage is generated from the thermoelectric conversion unit in proportion to the temperature difference.

According to the embodiment wherein the thermoelectric generator comprises the single thermal conductor, the single thermal accumulator and at least one pair of the thermoelectric conversion unit and the thermal flow control unit which is arranged between the thermal conductor and the thermal accumulator, wherein the thermoelectric conversion unit contacts with the thermal conductor at one side thereof and the thermal accumulator at the other side thereof, and the thermal accumulator is covered by the covering layer except the area thereof contacting with the thermoelectric conversion unit, wherein the auxiliary thermal conduction unit or the thermal flow switch as the thermal flow control unit is arranged in the covering layer. Thus, when the temperature of the thermal conductor is in the vicinity of the highest temperature thereof or the lowest temperature thereof, the auxiliary thermal conduction unit or the thermal flow switch causes heat transfer between the thermal conductor and the thermal accumulator, on the other hand, when the temperature of the thermal conductor is out of the vicinity of the highest temperature thereof or the lowest temperature thereof, the auxiliary thermal conduction unit or the thermal flow switch stops the heat transfer, so that great temperature difference is automatically caused between the thermal conductor and the thermal accumulator, and electric voltage is generated from the thermoelectric conversion unit in proportion to the temperature difference.

According to the present invention, the thermoelectric conversion unit is arranged between the thermal conductor and the thermal accumulator which differ in temperature or the thermal accumulators which differ in temperature or the both, and heat energy is transferred through the thermoelectric conversion unit by the temperature difference, and a part of the heat energy is converted into electric energy by the thermoelectric conversion unit, and thereby, electricity is generated. In this case, the more effective electric power generation can be achieved by storing and releasing a requisite amount of heat for heat difference needed to generate electricity while constantly storing a certain amount of heat in the thermal accumulator (so-called exergy).

Thus, according to the present invention, it is possible to obtain electric energy by only arranging the thermoelectric generator in an environment whose temperature increases and decreases repeatedly, and it is not necessary to supply heat to one side of a thermoelectric conversion unit through heating and release heat from the other side of the thermoelectric conversion unit through cooling in order to cause temperature difference between both sides of the thermoelectric conversion unit.

BRIEF DESCRIPTION OF THE DRAWINGS

FIGS. 7A and 7B are enlarged views of the neighborhood of the auxiliary thermal conduction unit shown in FIG. 6.

FIGS. 8A and 8B are enlarged views of the neighborhood of the auxiliary thermal conduction unit shown in FIG. 6.

BEST MODE FOR CARRYING OUT THE INVENTION

A preferred embodiment of the present invention will be described below with reference to accompanying drawings. A thermoelectric generator according to the present invention is designed to arrange in an environment whose temperature increases and decreases repeatedly. Here, the term "environment" includes, for example, the inside of outdoor air whose temperature is periodically changed during day and night, the neighborhood or surface of mechanical appliances which are arranged indoor and change temperature thereof according to operating condition and so on.

Figure 1:
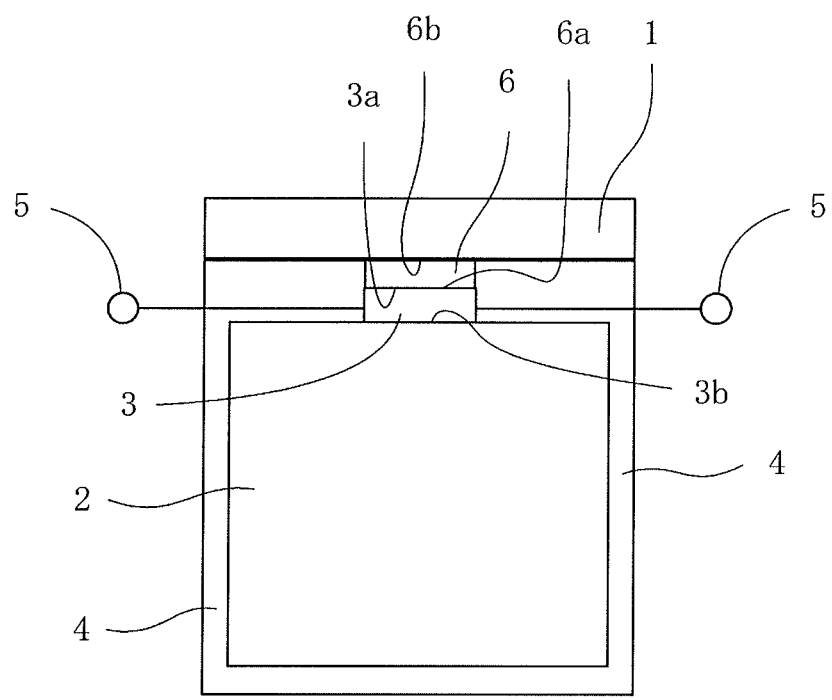
FIG. 1 is a longitudinal sectional view of a thermoelectric generator according to one embodiment of the present invention.

FIG. 1 is a longitudinal sectional view of a thermoelectric generator according to an embodiment of the present invention. In the embodiment shown in FIG. 1, the thermoelectric generator comprises a single thermal conductor 1 contacting with the environment to conduct thermal exchange with the environment, a single thermal accumulator 2, and at least one pair (in this embodiment, one pair) of a thermoelectric conversion unit 3 and a thermal flow control unit 6, each pair being arranged between the thermal conductor 1 and the thermal accumulator 2. In this embodiment, the thermal flow control unit 6 is a thermal resistor.

The thermoelectric conversion unit 3 and the thermal resistor 6 contact with each other at one sides 3a, 6a thereof, and the thermal resistor 6 contacts with the thermal conductor 1 at the other side 6b thereof, and the thermoelectric conversion unit 3 contacts with the thermal accumulator 2 at the other side 6b thereof. The positional relation between the thermoelectric conversion unit 3 and the thermal resistor 3 is not restricted to this embodiment, and so it is possible to arrange the thermoelectric conversion unit 3 and the thermal resistor 6 upside down. In this embodiment, although the thermal resistor 6 is separated from the thermoelectric conversion unit 3, the thermal resistor 6 may be incorporated into the thermoelectric conversion unit 3, or the thermoelectric conversion unit 3 has thermal resistance value corresponding to thermal resistance value of the thermal resister 6 (in this case, the thermal resistor is not needed).

The thermal accumulator 2 is covered by a covering layer 4 except an are thereof contacting with the thermoelectric conversion unit 3. The covering layer 4 has a thermal insulating property, that is, a certain amount of thermal resistance, where the thermal resistance of the covering layer 4 is sufficiently high (order of magnitude) compared to the total thermal resistance of a thermal network composed of the thermal conductor 1, the thermoelectric conversion unit 3, the thermal resistor (thermal flow control unit) 6 and the thermal accumulator 2. As long as the covering layer 4 has a thermal insulating property and is capable of covering the thermal accumulator 2 except the area thereof contacting with the thermoelectric conversion unit 3, a material and a construction of the covering layer is not restricted. In this embodiment, the covering layer consists of an appropriate heat insulating material available in the market.

Preferably, the thermal conductor 2 covered by the covering layer 4 has a rounded shape whose surface are as small as possible. As the thermoelectric conversion unit 3, any unit capable of converting heat energy into electric energy. In this embodiment, the thermoelectric conversion module based on Seebeck effect is used. In FIG. 1, the reference numeral 5 designates a pair of electrodes of the thermoelectric conversion module.

Preferably, the thermal conductor 1 has a configuration capable of exchanging heat with the environment as effectively as possible. Therefore, for example, when an installation environment of the thermoelectric generator is the inside of outdoor air, in order to ensure the largest possible surface area of the thermal conductor 1, preferably, the thermal conductor 1 has concavity and convexity thereon, and a surface of the thermal conductor is roughened (acceleration of heat transfer and convection). Further, preferably, the surface of the thermal conductor 1 has dark color such as black (acceleration of reflection). For example, when an installation environment of the thermoelectric generator is a surface of mechanical appliances which change temperature thereof according to operating condition, preferably, the thermal conductor 1 has a shape adapted to the surface of the mechanical appliances in order to be attached firmly to the surface (acceleration of heat transfer).

When an environment is the inside of outdoor air, it is preferable to design the thermal conductor 1 or a main body of the thermoelectric generator to move in such a manner that a heat exchange surface of the thermal conductor can be adjusted to face the sun so as to effectively receive insolation during any season or throughout the day. According to a further embodiment of the present invention, a reflector or a collector (collecting lens) is arranged in front of the thermal conductor 1 to increase an amount of heat which the thermal conductor 1 is received from the environment.

The thermal accumulator 2 may be a waterproof container filled with a liquid such as water. In this case, the container has thermal conductivity at least at an area thereof contacting with the thermoelectric conversion unit. As the liquid, any kind of liquid can be used as long as the liquid causes less decay and freeze. For example, pure water, or pure water containing antifreeze liquid, or pure water containing antiseptic agent can be used. Further, the term "liquid" also includes gel.

The thermal accumulator 2 may be metal or non-metal in the form of a solid. In this case, as the thermal accumulator 2, a mass of aluminum or a mass of plastic or a mass of concrete is used preferably. The thermal accumulator 2 may be one or more latent heat storage means. In this case, a kind of phase transition material is not restricted. The latent heat storage means is made of sodium acetate hydrate and sodium sulfate hydrate and paraffin of refined petroleum product and so on, and heat of fusion or solidification thereof at temperature of phase transition is utilized. By using the latent heat storage means, higher thermal capacity of a thermal accumulator is acquired in comparison with a thermal accumulator made of liquid or solid having a constant specific heat.

Figure 5A:
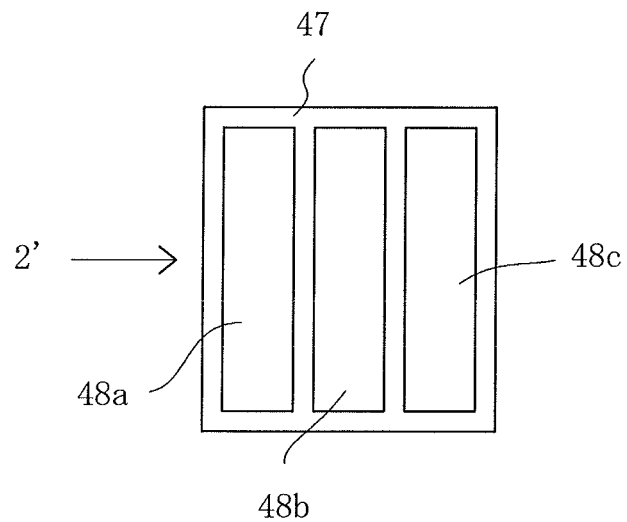
FIG. 5A is a longitudinal sectional view of a modification of the thermal accumulator of the thermoelectric generator shown in FIG. 1.

In this case, the thermal accumulator is preferably composed of a plurality of latent heat storage means having different phase transition temperatures, respectively. An example of thermal accumulators having such configuration is shown in FIG. 5. Referring to FIG. 5A, in this embodiment, a thermal accumulator 2' comprises a casing 47 having thermal conductivity, and three latent heat storage means 48a-48c arranged in the casing 47 to function at different temperatures within the operational temperature range of the thermal accumulator 2'. In this embodiment, each of the latent heat storage means 48a-48c is in liquid or gel state and charged into a dedicated container. An interior space of the casing 47 is divided into three sub-spaces by partition walls having thermal conductivity and the latent heat storage means 48a-48c are arranged in the sub-spaces, respectively. The partition walls effect uniform heat exchange among the latent heat storage means 48a-48c and provided as needed. When the latent heat storage means 48a-48c are granulated, a mixture of them is arranged in the casing 47.

Figure 5B:
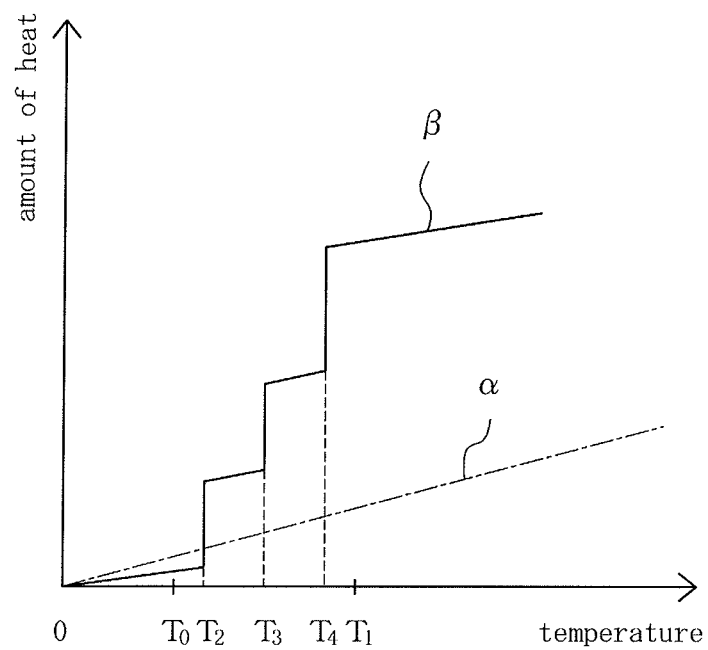
FIG. 5B is a graph of the change of storage of heat (heat discharge) of the thermal accumulator shown in FIG. 5A against the change of temperature.

FIG. 5B is a graph the change of storage of heat (heat discharge) against the change of temperature to compare the thermal accumulator 2' shown in FIG. 5A with a conventional thermal accumulator made of liquid or solid having a constant specific heat. In this graph, a line α represents the conventional thermal accumulator and a polygonal line β represents the thermal accumulator 2'. A range T0-T1 represents the operational temperature range of the thermal accumulator, and alphabets T2, T3 and T4 represent temperatures at which the first, second and third latent heat storage means 48a, 48b, 48c function, respectively. Here, effects of thermal resistance and thermal capacity of the latent heat storage means 48a-48c is not taken into account in the polygonal line β.

Now, for example, when the thermal accumulator operates within a range between T0=5° C. through T1=25° C. (temperature difference=20° C.), and the weight, the heat of fusion and the specific heat of each latent heat storage means 48a-48c are 200 g, 200 kJ/kg, and 2 kJ/(kg·K), respectively, and the specific heat etc. of the casing 47 is neglected, concerning the thermal accumulator 2', An amount of latent heat=200 (kJ/kg)×0.6 (kg)=120 (kJ);

An amount of sensitive heat=2 (kJ/(kg·K))×0.6 (kg)× 20 (K)=24 (kJ); and

Total amount of heat=120 (kJ)+24 (kJ)=144 (kJ).

On the other hand, when a temperature of a conventional thermal accumulator made of 0.6 kg of water (whose specific heat is the highest in nature) is changed so as to cause the temperature difference of 20° C., Total amount of heat (only sensitive heat)=4.2 (kJ/ (kg·K))×0.6 (kg)×20 (K)=50.4 (kJ).

And, 144 (kJ)/50.4 (kJ)=2.86.

It is seen from this that the thermal accumulator 2' with the specific heat 2.86 times higher than water is obtained. It is, therefore, possible to provide a thermoelectric generator, although compact, can produce a large amount of electricity.

The thermal resistance of the thermal resistor 6 is determined in such a way that the temperature of the thermal accumulator 2 is maintained near intermediate between the highest and lowest temperatures of the thermal conductor 1, taking the thermal capacity of the thermal accumulator 2 and the generating efficiency of the thermoelectric conversion unit 3 (heat transfer on electric generation by the thermoelectric conversion unit) into account. At design of the thermoelectric generator, the thermal resistance value of the thermal resistor 6 is determined based on a thermal time constant defined as a numerical value which is calculated by multiplying the thermal capacity of the thermal accumulator 2 by a sum of a thermal resistance value between the thermal conductor 1 and the environment, a thermal resistance value between the thermal conductor 1 and the thermal resistor 6, a thermal resistance value of between the thermal resistor 6 and the thermoelectric conversion unit 3, and a thermal resistance value between the thermoelectric conversion unit 3 and the thermal accumulator 3. In this case, the thermal time constant is determined in such a way that a definite delay is caused between a repetition cycle of ups and downs of the temperature of the environment (that is, a repetition cycle of ups and downs of the temperature of the thermal conductor 1) and a repetition cycle of ups and downs of the temperature of the thermal accumulator 2 so as to effect the temperature difference required for electric generation between the thermal conductor 1 and the thermal accumulator 2. As the thermal resistor 6, for example, a metal rod or a metal plate or a set of metal fibers or a set of synthetic fibers can be used.

Even though the thermal accumulator 2 is not completely covered by the covering layer 4 and a part of the surface of the thermal accumulator 2 contacts with the environment due to designing or structural restriction, it is not a problem when the definite thermal insulating property is ensured and the thermal time constant is appropriately determined based on the value calculated by multiplying the thermal capacity of the thermal accumulator 2 by the sum of the thermal resistances as mentioned above.

An operation of the thermoelectric generator according to the present invention will be explained below. Now, a case that the thermoelectric generator is arranged in outdoor air will be considered. It is well known that the average of temperature difference between the highest and lowest atmospheric temperatures during the day in every region of Japan is about 10° C. Therefore, it is assumed that a temperature difference during the day is about 10° C. in the installation environment of the thermoelectric generator.

Although this embodiment assumes the atmospheric temperature in Japan located at 30 to 45 degrees north latitude and surrounded by the sea, it will be obvious to those skilled in the art that the thermoelectric generator according to the present invention can be normally operates regardless of regions because ups and downs of atmospheric temperature are repeated with repetition of day and night in all places on the earth.

Figure 2A:
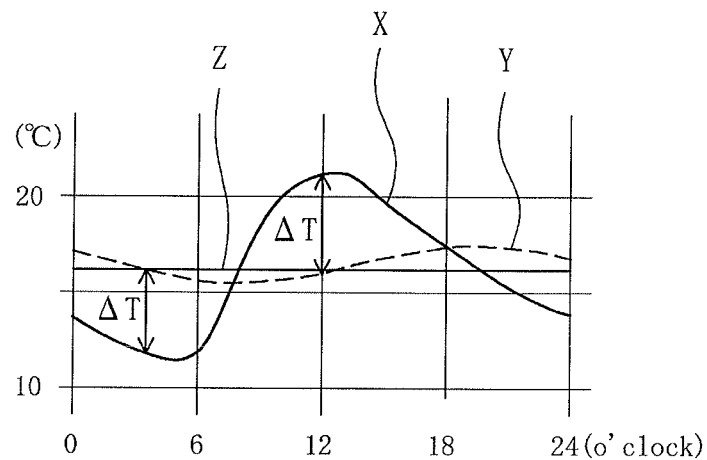
FIGS. 2A through 2C are graphs of change of temperature of both a thermal conductor and a thermal accumulator when the thermoelectric generator shown in FIG. 1 is arranged in outdoor air.
Figure 2B:
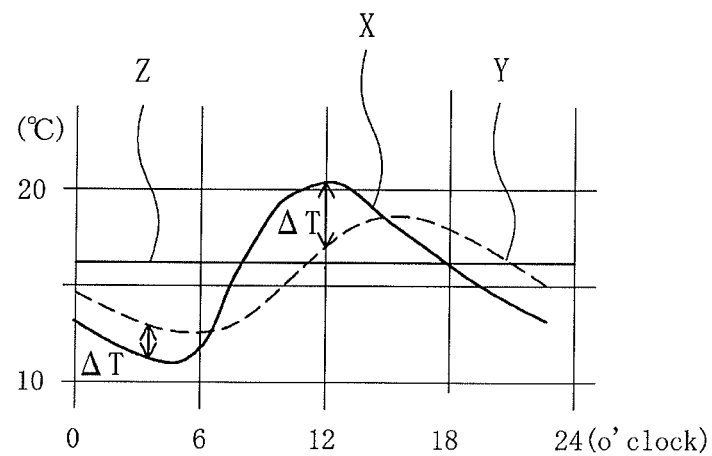
Figure 2C:
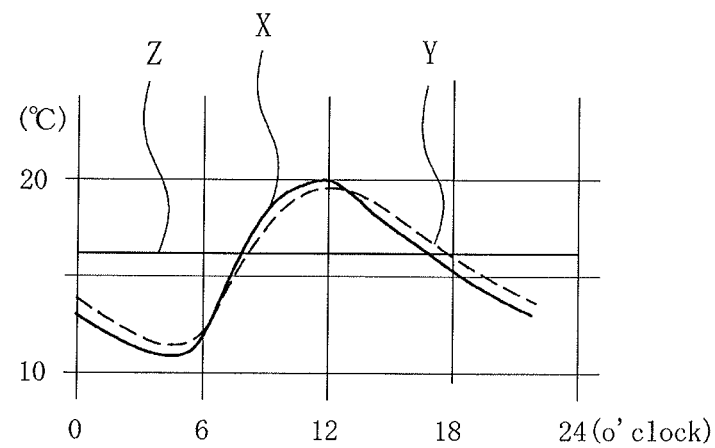

FIGS. 2A to 2C are graphs of examples of daily changes of temperature of both the thermal conductor 1 and the thermal accumulator 2 of the thermoelectric generator according to the present invention in such environment. In the graph shown in each of FIGS. 2A to 2C, a vertical axis represents temperature (° C.), a horizontal axis represents time (o'clock), curves X and Y represent the change of temperature of the thermal conductor 1 and the change of temperature of the thermal accumulator 2, respectively, and a line Z represents the average temperature of the thermal accumulator 2. As is obvious from the curve X of the graph shown in FIGS. 2A to 2C, the temperature of the thermal conductor 1 increases and decreases within a temperature range of about 10° C. with change of atmospheric temperature.

Also, heat transfer is caused between the thermal conductor 1 and the thermal accumulator 2, so that the temperature of the thermal accumulator 2 changes, but the change of temperature of the thermal accumulator 2 lags behind the change of temperature of the thermal conductor 1 according to the thermal time constant determined by multiplying the thermal capacity of the thermal accumulator 2 by the total thermal resistance of the thermal network composed of the thermal conductor 1, the thermal resistor 6, the thermoelectric conversion unit 3 and the thermal accumulator 2 (phase shifting of the change of temperature).

Furthermore, heat leaks from the covering layer 4 because of finiteness of thermal resistance of the covering layer 4, and heat transfer is caused on generating electricity by the thermoelectric conversion unit 3. As a result, the temperature of the thermal accumulator 2 changes in the vicinity of intermediate temperature between the highest and lowest temperatures of the thermal conductor, and then the temperature difference between the thermal conductor 1 and the thermal accumulator 2 changes within a range of 0° C. to about 5° C., wherein the maximum value of the temperature difference is about 5° C. corresponding to a half of the difference between the highest and lowest temperatures of the thermal conductor 1 (about 10° C.).

FIG. 2B is a graph of an example of daily changes of temperature of both the thermal conductor 1 and the thermal accumulator 2 when the thermal capacity of the thermal accumulator 2 and the total thermal resistance of the thermal network composed of the thermal conductor 1, the thermal resistor 6, the thermoelectric conversion unit 3 and the thermal accumulator 2 are determined so as to effect the temperature difference between the thermal conductor 1 and the thermal accumulator 2 required for electric generation. In this graph, the thermal time constant is determined in such a manner that the change of temperature of the thermal accumulator 2 is out of phase with the change of temperature of the thermal conductor 1 by 45 degrees (3 hours) when considered a graph of daily change of atmospheric temperature (that is, daily change of temperature of the thermal conductor 1) to be a sine wave whose period is 24 hours. In this case, the thermal time constant is determined as follows: First, the following definition is adopted.

R=the total thermal resistance of the thermal network composed of the thermal conductor 1, the thermal resistor 6, the thermoelectric conversion unit 3 and the thermal accumulator 2, C=the thermal capacity of the thermal accumulator 2, and $\omega=2\pi f$=an angular frequency (f designates a frequency).

Because the phase difference is 45 degrees, absolute value of the thermal resistance R is equal to absolute value of the thermal resistances (impedance) $1/\omega C$ with respect to a sine wave AC of the thermal accumulator 2, namely, $R=1/\omega C$.

Therefore, the thermal time constant t is obtained as follows:

The thermal time constant $t=RC=1/2\pi f=24/2\pi=3.82$ (hours)

[$f=1/24$, since a period=24 hours]

In this graph, the temperature difference $\Delta T$ is maintained at about 80% without decreasing to a half because the phase difference is effected between the changes of temperature of the thermal conductor 1 and thermal accumulator 2, even though an amount of the change of temperature of the thermal accumulator 2 exceeds a half of an amount of the change of temperature of the thermal conductor with increasing an amount of heat transferred by the electric generation. Thus the temperature difference of about 5° C. between the thermal conductor 1 and the thermal accumulator 2 available for electric generation throughout the day is ensured. Then the electric generation is carried out by means of this temperature difference $\Delta T$ twice a day, that is, at raising and dropping temperature of the thermal conductor 1, and a value of integral thereof corresponds to electric power energy of one cycle (one cycle of days and nights).

On the other hand, as shown in the graph of FIG. 2C, when the thermal accumulator 2 has less thermal capacity, or the thermal resistance between the thermal conductor 1 and thermal accumulator 2 is low, the curve Y gradually comes close to the curve X and the temperature difference between the thermal conductor 1 and thermal accumulator 2 is too small to achieve available electric generation. As shown in the graph of FIG. 2A, when the thermal accumulator 2 has more thermal capacity, or the thermal resistance between the thermal conductor 1 and the thermal accumulator 2 is high, the curve Y gradually becomes flat and comes close to the line Z representing the mean temperature. As a result, the temperature difference between the thermal conductor 1 and the thermal accumulator 2 is large. This design is not realistic, although available electric generation can be achieved.

According to the present invention, in order to achieve available electric generation throughout the day, the thermal time constant is determined to be equal to or more than 2.4 hours. The 2.4 hours equal to be 1/10 of a 24 hour period when a graph of change of temperature throughout the day corresponds to a sine wave whose period is 24 hours.

Next, the electric energy generated in the graph of FIG. 2B will be estimated. For example, when the thermal accumulator 2 is composed of a container filled with a 1000 mL of water and a thermal capacity of the container is negligible, it is legitimate according to the above consideration to assume that a change of temperature of the thermal accumulator 2 is about 2° C. Since a specific heat of water is 1 cal/g and 1 cal=4.2 J, the thermal capacity of the thermal accumulator $2=1\times1000\times2=2000$ (cal)=8400 (J)=8400 (Ws)= 2.33 (Wh). Although the 2000 cal of heat quantity is theoretically converted into 2.33 Wh of electric energy (1 J=1 Ws), the thermoelectric conversion unit 3 has a limitation of energy conversion efficiency from heat to electricity. On the condition that the power generation efficiency of the thermoelectric conversion unit 3 is 5%, the electric energy obtained by the electric generation is 116.7 mWh. A 233 mWh of electric energy is obtained per day, if it is possible to acquire an equal amount of electric energy twice a day, that is, day and night. Thus a certain amount of heat energy can be converted into a certain amount of electric energy by a thermoelectric generator with a certain level of power generation efficiency.

While a 1000 mL of water can be charged into a cubic container, 10 cm on a side, by means of the thermal accumulator 2 composed of a rectangular solid container with width 2.5 cm, length 4 cm and height 10 cm filled with a 100 mL of water, a 23.3 mWh of electric energy per day can be obtained if the same power generation efficiency as before is achieved.

This amount of electric energy is enough to operate conventional micropower electronics (several µW of power consumption). For example, the electric energy required for operating an electronic device whose power consumption is 50 µW all day and night (for 24 hours) is 50×24=1,200 µWh=1.2 mWh, and this amount of electric energy can be supplied sufficiently though a power generation efficiency of a thermoelectric generator is further one-quarter or one-fifth of 5%.

When the thermal accumulator 2 is made of a mass of aluminum whose volume is 100 mL and a change of temperature of the thermal accumulator 2 is about 2° C., since specific heat and specific weight of aluminum are 0.21 cal/g and 2.7, respectively, the thermal capacity of the thermal accumulator 2=0.21×2.7×100×2=113.4 (cal)=476 (J)=476 (Ws)=0.132 (Wh). On the condition that the power generation efficiency of the thermoelectric conversion unit 3 is 5%, the electric energy obtained by the electric generation is 6.6 mWh. A 13.2 mWh of electric energy (about 0.57 times more than that of the thermal accumulator made of water) is obtained per day, if it is possible to acquire an equal amount of electric energy twice a day, that is, day and night. In this case, aluminum is more expensive than water, but easy to handle, and therefore, a structure of the thermal accumulator 2 can be more simplified by using aluminum instead of water.

The thermoelectric generator according to the present invention comprises the thermal conductor 1 thermally contacting the environment whose temperature increases and decreases repeatedly, the thermal accumulator 2 insulated from the influence of heat of the environment because of the covering layer, and the thermoelectric conversion unit 3 thermally contacting with the thermal conductor 1 through the thermal resistance 6 at on side thereof and thermally contacting with the thermal accumulator 2 at the other side thereof. Thus the temperature of the thermal conductor 1 changes with a change of temperature of the environment while the temperature of the thermal accumulator 2 is maintained near intermediate temperature between the highest and lowest temperatures of the thermal conductor 1, so that electric voltage is generated from the thermoelectric conversion unit 3 in proportion to the temperature difference caused automatically between the thermal conductor 1 and the thermal accumulator 2.

Therefore, according to the present invention, it is possible to obtain electric energy by only arranging the thermoelectric generator in an environment whose temperature increases and decreases repeatedly, and it is not necessary to supply heat to one side of a thermoelectric conversion unit through heating and release heat from the other side of the thermoelectric conversion unit through cooling in order to cause temperature difference between both sides of the thermoelectric conversion unit. When the thermoelectric generator of the present invention is used as a power source of an electronic device such as a wireless sensor and a remote monitor, it is not necessary to provide a wiring for electric power supply from the power source to the electronic device or change a battery, and consequently, it is possible to install the electronic device freely at the place where it is required.

According to another preferred embodiment, the thermoelectric generator is installed at a place where the thermal conductor 1 can receive the direct rays and scattering rays of the sun and the thermal conductor 1 is designed in such a way that it is easy to receive solar insolation during the day and be subject to radiative cooling during the night. Thereby the temperature difference of the highest and lowest temperatures of the thermal conductor 1 becomes larger and the electric-generating capacity of the thermoelectric generator is further increased.

In this case, preferably, a surface of the thermal conductor 1 is smoothed to minimize area of contact between the thermal conductor 1 and outdoor air, which prevents the thermal conductor 1 from being cooled by air when the temperature of the thermal conductor 1 is higher than that of outdoor air by the solar insolation and being warmed by air when the temperature of the thermal conductor 1 is lower than that of outdoor air by the radiative cooling. Furthermore, in this case, in order to block the effect of air, a transparent plate made from glass etc. may be attached to the thermal conductor 1 and a vacuum space may be formed between the thermal conductor 1 and the plate for heat insulation. The transparent plate is preferably made from appropriate material(s) in view of its (their) permeation property, reflectance property and absorption property with respect to solar ray and infrared ray.

Figure 3A:
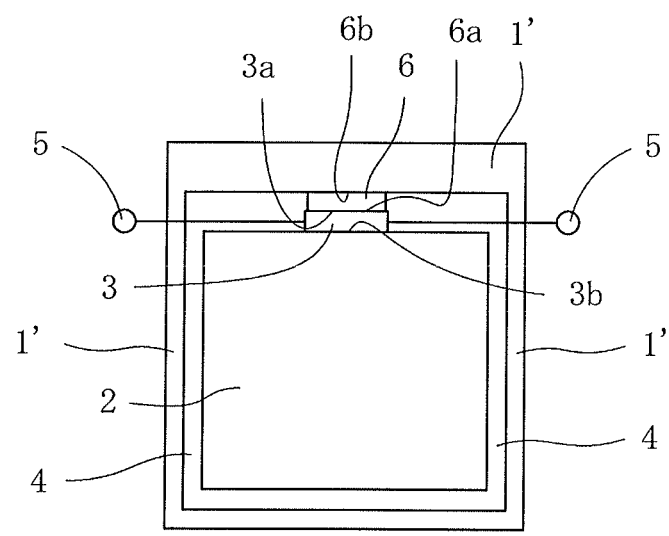
FIGS. 3A and 3B are longitudinal sectional views similar to FIG. 1, showing a thermoelectric generator according to another embodiment of the present invention.
Figure 3B:
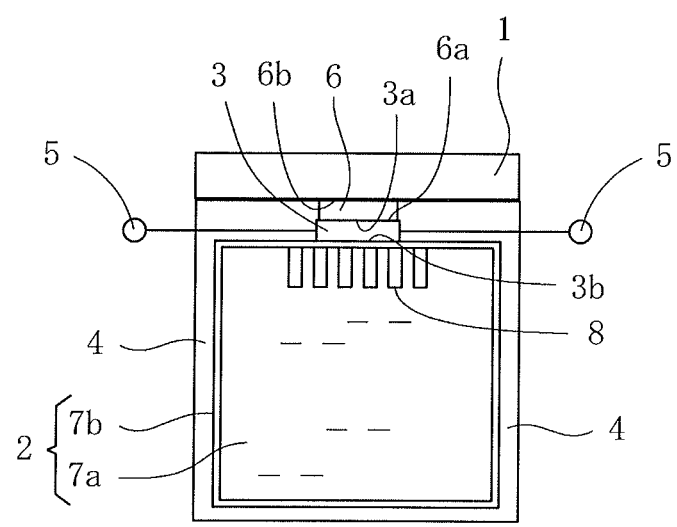

FIGS. 3A and 3B are longitudinal sectional views similar to FIG. 1, showing a thermoelectric generator according to another embodiment of the present invention. In FIGS. 3A and 3B, the same elements as shown in FIG. 1 are identified with the same reference numerals as used in FIG. 1, and the detailed explanation thereof will be omitted in what follows. Referring to FIG. 3A, in this embodiment, a thermal conductor 1' covers the whole of surface of the covering layer 4. According to this configuration, the surface of the thermal conductor 1' is considerably increased without increasing a volume of the thermoelectric generator, and thereby, the heat-change efficiency of the thermal conductor 1' with the environment is further increased. In addition, when the thermal conductor 1' is made from hard material such as metal, the thermal accumulator 2, the thermal resistor 6, the thermoelectric conversion unit 3 and the covering layer 4 can be protected by the thermal conductor 1'.

Referring to FIG. 3B, in this embodiment, the thermal accumulator 2 is composed of a container 7b filled with a liquid 7a. In this case, it is preferable to arrange a means accelerating heat transfer and convection of the liquid 7a within the container 7b, for example by attaching a plurality of fins designed for heat exchange to the inside wall of the container 7b at intervals therebetween.

Figure 4:
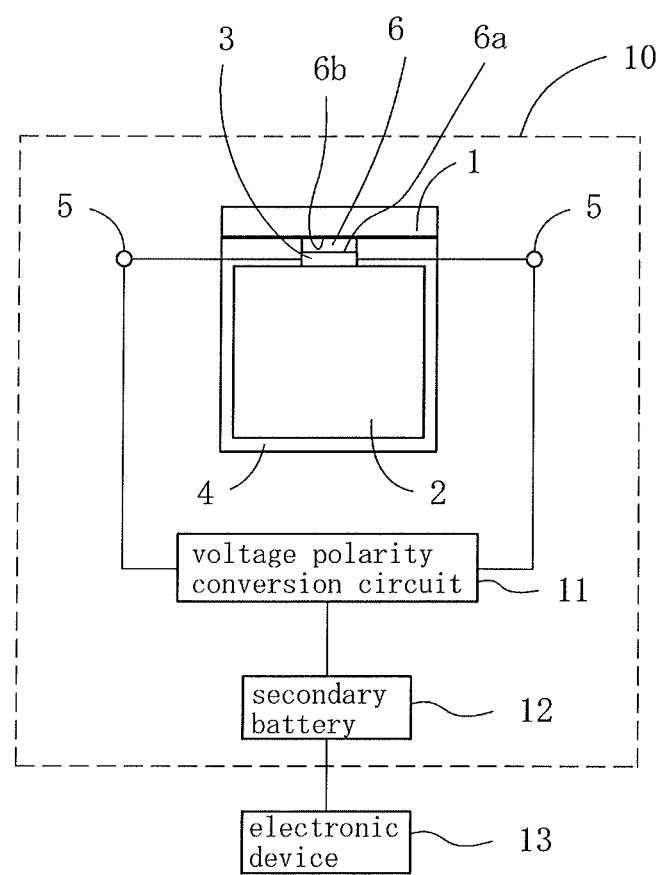
FIG. 4 is a view illustrating an embodiment in which the thermoelectric generator shown in FIG. 1 is used as a power source of an electronic device.

FIG. 4 is a view illustrating an embodiment in which the thermoelectric generator of the present invention is incorporated into a power source section of a micropower electronic device. In FIG. 4, the same elements as shown in FIG. 1 are identified with the same reference numerals as used in FIG. 1, and the detailed explanation thereof will be omitted in what follows. Referring to FIG. 4, according to the thermoelectric generator of the present invention, because an alternate current is generated between a pair of electrodes 5 of the thermoelectric conversion unit 3 with change of temperature of the installation place of the thermoelectric generator, a power source section 10 comprises a voltage polarity conversion circuit 11 connected between the electrode pair 5 and a secondary battery 12 such as a lithium-ion battery at an output of the circuit 11 as well as the thermoelectric conversion unit.

Thus the electricity generated by the thermoelectric generator is temporarily stored in the secondary battery 12, and supplied from the secondary battery 12 to the electronic device 13. Consequently, it is possible to stably supply electricity to the electronic device 13 when needed to operate the electronic device 13. In this embodiment, although the thermoelectric generator of the present invention is built in an electronic device 13 or arranged independently of the electronic device 13, a part of the electronic device 13 (for example, a casing) may constitute a part or the whole of the thermal conductor of the thermoelectric generator. Moreover, the electronic device 13 may be arranged within the thermal accumulator of the thermoelectric generator. According to this embodiment, the temperature of the electronic device 13 can be maintained near intermediate temperature between the highest and lowest temperatures of the environment, and therefore, the electronic device 13 can be protected against thermal stress and operated stably.

Figure 6:
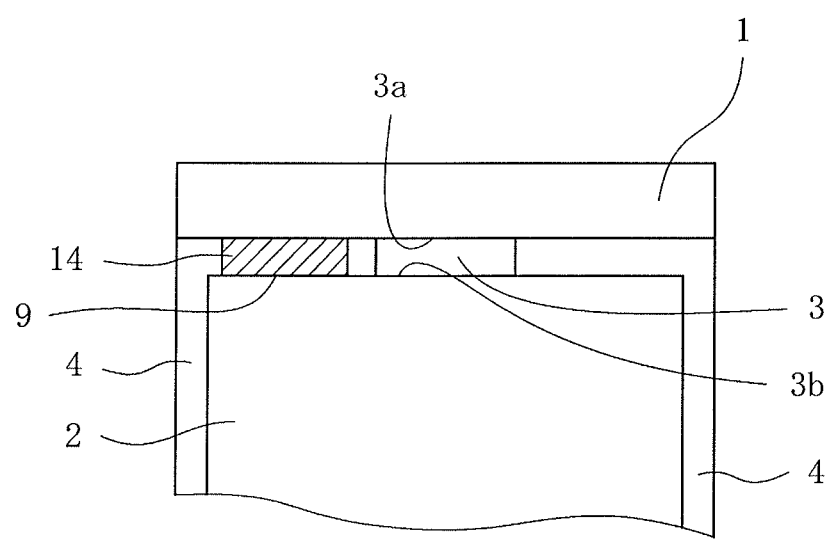
FIG. 6 is an enlarged longitudinal sectional view of a main part of a thermoelectric generator according to a further embodiment of the present invention.

FIG. 6 is an enlarged longitudinal sectional view of a main part of a thermoelectric generator according to a further embodiment of the present invention. The embodiment shown in FIG. 6 differs from the embodiment shown in FIG. 1 only in not arranging the thermal resistor 6 as the thermal flow control unit in series with the thermoelectric conversion unit 3 but arranging an auxiliary thermal conduction unit as the thermal flow control unit in the covering layer 4. Therefore, in FIG. 6, the same elements as shown in FIG. 1 are identified with the same reference numerals as used in FIG. 1, and the detailed explanation thereof will be omitted in what follows.

Referring to FIG. 6, in this embodiment, the auxiliary thermal conduction unit 14 is incorporated between the thermal conductor 1 and the thermal accumulator 2 in the covering layer 4. In this embodiment, although a single auxiliary conduction unit 14 is incorporated, a plurality of the auxiliary conduction unit 14 may be incorporated as necessary. The auxiliary conduction unit 14 is attached in an opening 9 which extends through the covering layer 4 and between the thermal conductor 1 and the thermal accumulator 2. The auxiliary conduction unit 14 thermally expands and contracts or thermally deforms so as to move between a first position in which the auxiliary thermal conduction unit 14 contacts with both the thermal conductor 1 and the thermal accumulator 2 to effect the heat transfer between the thermal conductor 1 and the thermal accumulator 2 through the auxiliary thermal conduction unit 14 and a second position in which the auxiliary thermal conduction unit 14 separates from at least one of the pair of the thermal conductor 1 and the thermal accumulator 2 to stop the heat transfer. The auxiliary thermal conduction unit 14 is located at the first position when the temperature of the thermal conductor 1 is in the vicinity of the highest temperature thereof or the lowest temperature thereof, and is located at the second position during the remainder of term.

FIGS. 7A-7B and 8A-8B are enlarged views of the neighborhood of the auxiliary thermal conduction unit shown in FIG. 6, each of these drawings showing examples of the auxiliary conduction unit. In the embodiment shown in FIGS. 7A and 7B, the auxiliary conduction unit 14 is made of a bimetal 14a. The bimetal 14a has the shape of an arch, and is fixed to and in contact with the thermal accumulator 2 at both ends thereof in such a manner that the convex surface of the bimetal 14a is opposed to the thermal conductor 1. The bimetal 14a is highly deformed to be located at the first position in which the bimetal 14a contacts with the thermal conductor 1 at the top area thereof when the temperature of the thermal conductor 1 is in the vicinity of the highest (a high-temperature period of the thermal conductor 1) or lowest temperatures thereof (a low-temperature period of the thermal conductor 1) on the one hand (also see, FIG. 7B), and is deformed within an area of not contacting with the thermal conductor 1, that is, located at the second position during the remainder of term on the other hand (also see, FIG. 7A).

In the embodiment shown in FIGS. 8A and 8B, the auxiliary thermal conduction unit 14 is made of heat-shrinkable material 14b. As the heat-shrinkable material 14b, for example, a mass of heat-shrinkable gum containing metal powders for enhancing heat conductivity can be used. The heat-shrinkable material 14b is attached to and in contact with the thermal conductor 1 at the upper surface thereof. The heat-shrinkable material 14b is greatly expanded to be located at the first position in which the heat-shrinkable material 14b contacts with the thermal accumulator 2 at the lower surface thereof when the temperature of the thermal conductor 1 is in the vicinity of the highest (a high-temperature period of the thermal conductor 1) on the one hand (also see, FIG. 8B), and is expanded and contracted within an area of not contacting with the thermal accumulator 2, that is, located at the second position during the remainder of term on the other hand (also see, FIG. 8A).

Figure 9:
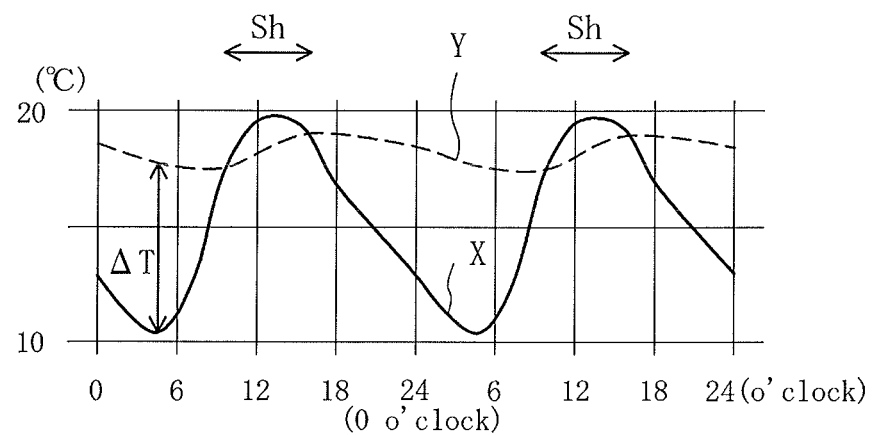
FIG. 9 is a graph similar to the graph of FIG. 2, illustrating an example of the change of temperature of both the thermal conductor and the thermal accumulator of the thermoelectric generator shown in FIG. 6 when arranged at the inside of outdoor air.

FIG. 9 is a graph similar to the graph of FIG. 2, illustrating an example of the change of temperature of both the thermal conductor 1 and the thermal accumulator 2 of the thermoelectric generator shown in FIG. 6 when arranged at the inside of outdoor air. In this graph, curves X and Y represent the change of temperature of the thermal conductor 1 and the change of temperature of the thermal accumulator 2, respectively. Further, in the graph of FIG. 9, a symbol "Sh" designates a period during the auxiliary conduction unit 14 is located at the first position.

As is clear from the graph of FIG. 9, according to the embodiment shown in FIG. 6, the temperature of the thermal accumulator 2 raises nearly to the temperature of the thermal conductor 1 during the high-temperature period of the thermal conductor 1, so that the temperature difference between the thermal conductor 1 and the thermal accumulator 2 of the embodiment with the auxiliary thermal conduction unit is twice as large as that of the embodiment without it, and correspondingly, electric voltage generated by the thermoelectric conversion unit 3 is doubled.

In this case, since the electric power increases as the square of the electric voltage assuming that a load resistance is constant, the electric power of the thermoelectric generator quadruples when the electric voltage is doubled. It is, therefore, possible to get more electric energy even though the thermal capacity of the thermal accumulator is not changed.

In the embodiment shown in FIG. 6, as the thermal flow control unit, the auxiliary thermal conduction unit thermally expanding and contracting or thermally deforming according to change of temperature of the thermal conductor 1 (change of temperature of the environment) so as to passively control heat transfer is used, but a thermal flow switch actively controlling heat transfer may be used instead of the auxiliary thermal conduction unit.

Figure 10:
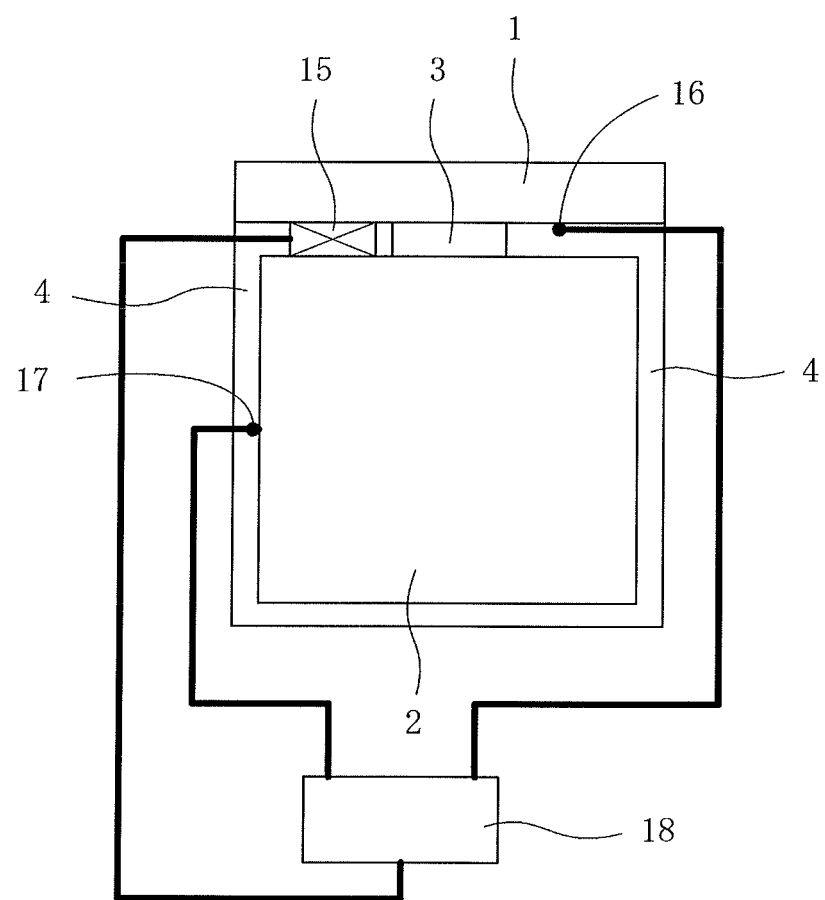
FIG. 10 is a view similar to FIG. 1, showing a thermoelectric generator according to a further embodiment of the present invention.

In FIG. 10, the thermoelectric generator provided with the thermal flow switch as the thermal flow control unit is shown. In FIG. 10, the same elements as shown in FIG. 6 are identified with the same reference numerals as used in FIG. 6, and the detailed explanation thereof will be omitted in what follows. In the embodiment shown in FIG. 10, the thermal flow switch 15 as the thermal flow control unit is arranged between the thermal conductor 1 and the thermal accumulator 1 in the covering layer 4. The thermal flow switch 15 is moved between an ON-position in which the thermal flow switch 15 contacts with both the thermal conductor 1 and the thermal accumulator 2 to effect heat transfer between the thermal conductor 1 and the thermal accumulator 2 through the thermal flow switch 15 and an OFF-position in which the thermal flow switch 15 separates from at least one of the pair of the thermal conductor 1 and the thermal accumulator 2 to stop the heat transfer. In this embodiment, although a single thermal flow switch 15 is incorporated, a plurality of the thermal flow switches 15 may be incorporated as necessary.

The thermoelectric generator further comprises a first temperature sensor 16 detecting temperature of the thermal conductor 1 and a second temperature sensor 17 detecting temperature of the thermal accumulator 2. The first and second temperature sensors 16, 17 are preferably arranged at positions as far away from the thermal flow switch 15 as possible, the positions indicating the central or mean temperatures of the thermal conductor 1 and the thermal accumulator 2. The thermoelectric generator further comprises a thermal flow switch controller 18 switching the ON-position and the OFF-position of the thermal flow switch 15 based on detection signals of the first and second temperature sensors 16, 17.

The thermal flow switch 15 basically functions in the same manner as the auxiliary thermal conduction unit 14. For example, in the case of more effectively increasing the temperature of the thermal accumulator 2 during the high temperature period of the thermal conductor 1, the thermal flow switch 15 is located at its ON-position when the thermal flow switch controller 18 determines based on the detection signals of the first and second temperature sensors 16, 17 that the temperature of the thermal conductor 1 is higher than that of the thermal accumulator 2 and the temperature difference therebetween is equal to or more than a predetermined value on the one hand, and the thermal flow switch 15 is located at its OFF-position when the thermal flow switch controller 18 determines based on the detection signals of the first and second temperature sensors 16, 17 that the temperature of the thermal conductor 1 is higher than that of the thermal accumulator 2 and the temperature difference therebetween is equal to or less than the predetermined value, or the temperature of the thermal conductor 1 is lower than that of the thermal accumulator 2 on the other hand. In this case, the thermal flow switch 15 is operated by means of a part of the output power of the thermoelectric generator.

Of course, it is possible to more effectively decreasing the temperature of the thermal accumulator 2 during the low temperature period of the thermal conductor 1. In this case, the thermal flow switch 15 is located at its ON-position only when the thermal flow switch controller 18 determines based on the detection signals of the first and second temperature sensors 16, 17 that the temperature of the thermal conductor 1 lower than that of the thermal accumulator 2 and the temperature difference therebetween is equal to or more than a predetermined value.

Figure 11A:
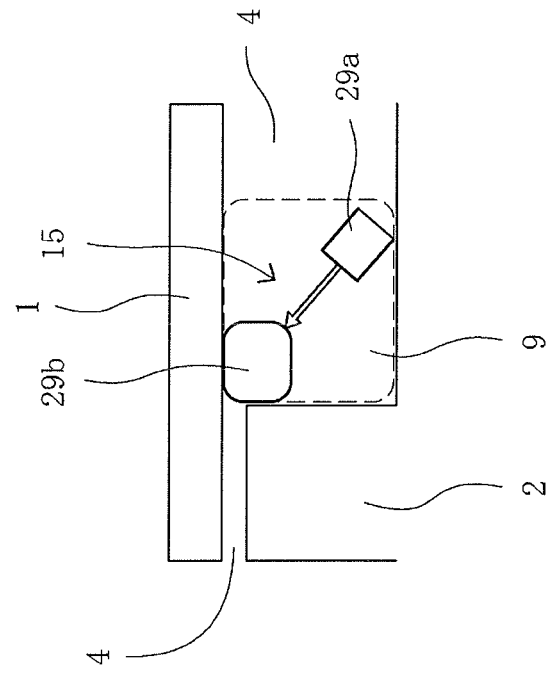
FIGS. 11A and 11B are enlarged views of the neighborhood of the thermal flow switch of the thermoelectric generator shown in FIG. 10.
Figure 11B:
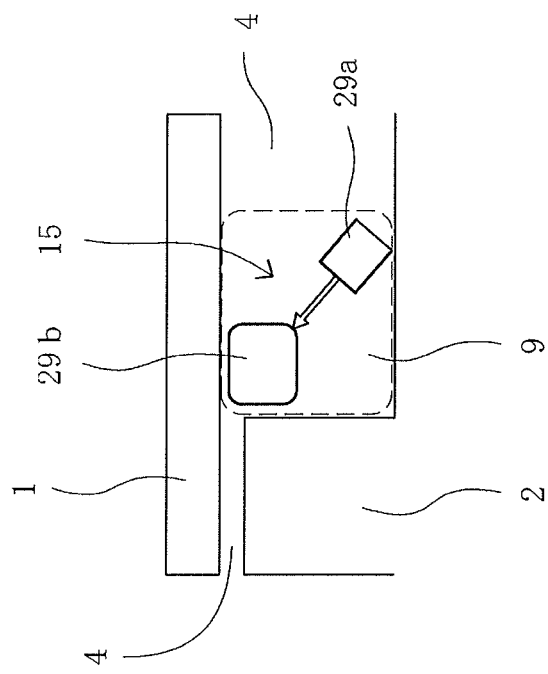

FIGS. 11A-11B and 12A-12B are enlarged views of the neighborhood of the thermal flow switch of the thermoelectric generator shown in FIG. 10, showing some examples of the thermal flow switch. In the embodiment shown in FIGS. 11A and 11B, the thermal flow switch 15 consists of a linear actuator 29a and a movable thermal conductive block 29b coupled to a head of a rod of the linear actuator 29a. When the thermal flow switch 15 is located at its OFF-position, as shown in FIG. 11A, the rod of the linear actuator 29a is located at its retracted position and the movable thermal conductive block 29b is separated from both the thermal conductor 1 and the thermal accumulator 2. On the other hand, for example, when the thermal flow switch controller 18 determines that the temperature of the thermal conductor 1 is higher than that of the thermal accumulator 2 and the temperature difference therebetween is equal to or more than a predetermined value, the thermal flow switch 15 is located at its ON-position, as shown in FIG. 11B, so that the rod of the linear actuator 29a is extended and the movable thermal conductive block 29b contacts with both the thermal conductor 1 and the thermal accumulator 2 and thereby heat transfer is caused from the thermal conductor 1 to the thermal accumulator 2. As a result, the thermal accumulator 2 is heated and its temperature is more effectively increased during the high temperature period of the thermal conductor 1.

Figure 12A:
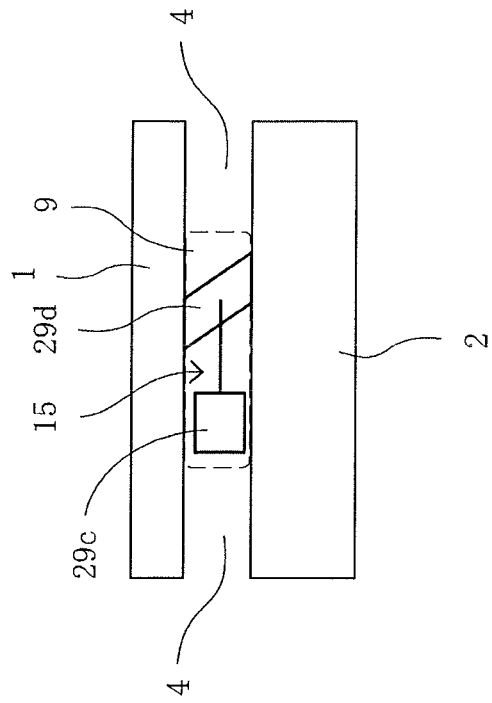
FIGS. 12A and 12B are enlarged views of the neighborhood of the thermal flow switch of the thermoelectric generator shown in FIG. 10.
Figure 12B:
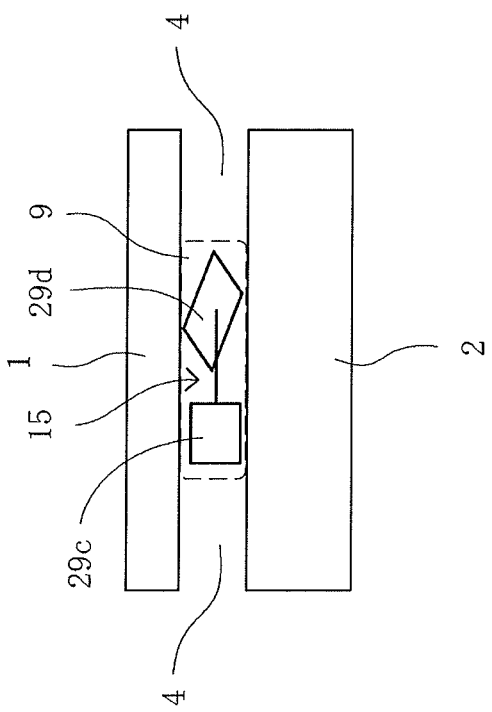

In the embodiment shown in FIGS. 12A and 12B, the thermal flow switch 15 consists of a rotary actuator 29c and a movable thermal conductive block 29d rotated by the rotary actuator 29c. When the thermal flow switch 15 is located at its OFF-position, as shown in FIG. 12A, the movable thermal conductive block 29d is separated from both the thermal conductor 1 and the thermal accumulator 2. On the other hand, for example, when the thermal flow switch controller 18 determines that the temperature of the thermal conductor 1 is higher than that of the thermal accumulator 2 and the temperature difference therebetween is equal to or more than a predetermined value, the thermal flow switch 15 is located at its ON-position, as shown in FIG. 12B, so that the movable thermal conductive block 29b is rotated by the rotary actuator 29c and contacts with both the thermal conductor 1 and the thermal accumulator 2 and thereby heat transfer is caused from the thermal conductor 1 to the thermal accumulator 2. As a result, the thermal accumulator 2 is heated and its temperature is more effectively increased during the high temperature period of the thermal conductor 1.

Although not shown in the figures, all of the above-mentioned actuators are preferably designed in such a way that they are driven electromagnetically by a ratchet mechanism or a worm gear mechanism or a brake mechanism only during operation of the thermal flow switch and do not consume electric energy at all under inactive condition of the thermal flow switch.

In the embodiments shown in FIGS. 11A-11B and 12A-12B, in order to improve the thermal conductivity, it is preferable that the contact surface of the movable thermal conductive blocks 29b, 29d is elastic and has a shape allowing tight contact with the thermal conductor 1 and the thermal accumulator 2. Further, in order to minimize heat leak, it is preferable that the surface of the thermal flow switch 15 except the contact surface thereof is covered by thermal insulating material.

According to still another embodiment not shown in figures, the thermoelectric conversion unit 3 is also used as the thermal flow switch 15. Namely, an electric voltage is applied to the thermoelectric conversion unit based on Seebeck effect by using the output power of the thermoelectric generator under control of the thermal flow switch controller 18, whereby heat generation (heating) and heat absorption (cooling) are caused by Peltier effect in the thermoelectric conversion unit and so, the thermoelectric conversion unit provides the same function as that of the thermal flow switch.

In this case, the ON-position of the thermal flow switch 15 is achieved by operating the thermoelectric conversion unit 3 to cause heat transfer from high-temperature one of a pair of the thermal conductor 1 and the thermal accumulator 2 to low-temperature one of the pair through Peltier effect, and the OFF-position of the thermal flow switch 15 is achieved by operating the thermoelectric conversion unit 3 to cause heat transfer from the low-temperature one to the high-temperature one through Peltier effect.

According to a further embodiment not shown in figures, the thermal flow switch 15 is arranged between the thermal conductor 1 and one side $3a$ of the thermoelectric conversion unit 3, or between the thermal accumulator 2 and the other end $3b$ of the thermoelectric conversion unit 3. Thus when the thermal flow switch 15 is located at its ON-position, the thermal flow switch 15 contacts with the thermal conductor 1 through the thermoelectric conversion unit 3, or contacts with the thermal accumulator 2 through the thermoelectric conversion unit 3.

According to a further embodiment not shown in figures, the thermal flow switch 15 comprises a container arranged between the thermal conductor 1 and the thermal accumulator 2 in the covering layer 4. The container contacts with the thermal conductor 1 thermally at one side thereof and the thermal accumulator thermally at the other side thereof. The thermal flow switch 15 further comprises a supply source of thermally-conductive fluid arranged in or on the covering layer 4, a pipe connecting between the supply source of thermally-conductive fluid and the container, and a pump provided in the middle of the pipe so as to supply the thermally-conductive fluid from the supply source into the container and pump back the thermally-conductive liquid to the supply source from the container. In this case, the ON-position of the thermal flow switch 15 is achieved by filling the container with the thermally-conductive liquid, and the OFF-position of the thermal flow switch 15 is achieved by emptying the container.

According to a further embodiment not shown in figures, when an enough thermal time constant is ensured, the surface of the thermal accumulator except the area contacting with the thermoelectric conversion unit 3 is subjected to mirror finishing and this surface of the thermal accumulator forms the covering layer. The mirror finishing is carried out by polishing or metallic plating.

Figure 13:
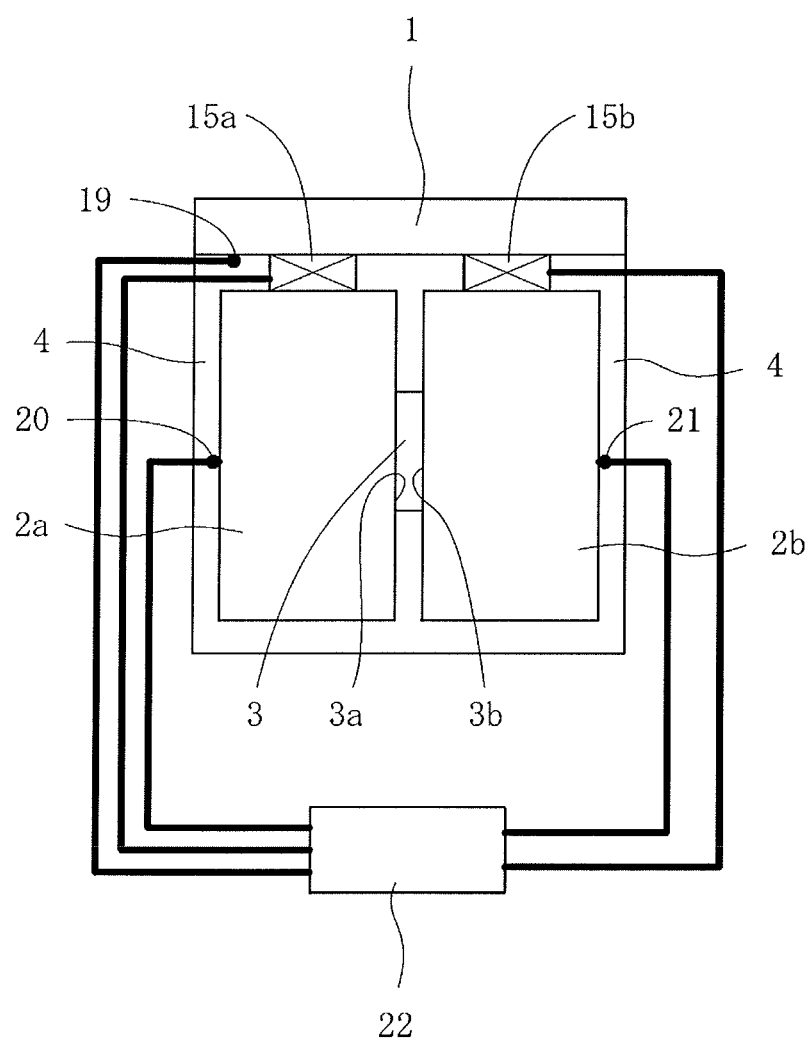
FIG. 13 is a longitudinal sectional view of a thermoelectric generator according to a further embodiment of the present invention.

FIG. 13 is a longitudinal sectional view of a thermoelectric generator according to a further embodiment of the present invention. In the embodiment shown in FIG. 13, the thermoelectric generator comprises a single thermal conductor 1, first and second thermal accumulators $2a$, $2b$, and at least one thermoelectric conversion unit 3 (in this embodiment, one thermoelectric conversion unit) arranged between the first and second thermal accumulators $2a$, $2b$ in such a manner that the thermoelectric conversion unit 3 contacts with the first thermal accumulator $2a$ at its one side $3a$ and the second thermal accumulator $2b$ at its other side $3b$ (a pair of electrodes of the thermoelectric conversion unit 3 is omitted in FIG. 13).

The thermoelectric generator also comprises at least one first thermal flow control unit $15a$ (in this embodiment, one first thermal flow control unit) arranged between the first thermal accumulator $2a$ and the thermal conductor 1 and at least one second thermal flow control unit $15b$ (in this embodiment, one second thermal flow control unit) arranged between the second thermal accumulator $2b$ and the thermal conductor 1. The first thermal flow control unit $15a$ is a first thermal flow switch movable between an ON-position in which the first thermal flow switch contacts with both the thermal conductor 1 and the first thermal accumulator $2a$ to effect heat transfer between the thermal conductor 1 and the first thermal accumulator $2a$ through the first thermal flow switch and an OFF-position in which the first thermal flow switch separates from at least one of the pair of the thermal conductor 1 and the first thermal accumulator $2a$ to stop the heat transfer. The second thermal flow control unit $15b$ is a second thermal flow switch movable between an ON-position in which the second thermal flow switch contacts with both the thermal conductor 1 and the second thermal accumulator $2b$ to effect heat transfer between the thermal conductor 1 and the second thermal accumulator $2b$ through the second thermal flow switch and an OFF-position in which the second thermal flow switch separates from at least one of the pair of the thermal conductor 1 and the second thermal accumulator $2b$ to stop the heat transfer.

The first thermal accumulator $2a$ is covered by a covering layer 4 except the area thereof contacting with the first thermal flow switch $15a$ and the thermoelectric conversion unit 3, and the second thermal accumulator $2b$ is covered by the covering layer 4 except the area thereof contacting with the second thermal flow switch $15b$ and the thermoelectric conversion unit 3.

The thermoelectric generator further comprises a first temperature sensor 19 detecting temperature of the thermal conductor 1, a second temperature sensor 20 detecting temperature of the first thermal accumulator $2a$, a third temperature sensor 21 detecting temperature of the second thermal accumulator $2b$, and a thermal flow switch controller 22 switching the ON-positions and the OFF-positions of the first and second thermal flow switches $15a$, $15b$ based on detection signals of the first through third temperature sensors 19-21.

In this embodiment, when the temperature of the thermal conductor 1 is near its highest temperature, the first thermal flow switch $15a$ is located at its ON-position and the second thermal flow switch $15b$ is located at its OFF-position and thereby, heat transfer is caused between the thermal conductor 1 and the first thermal accumulator $2a$ and the temperature of the first thermal accumulator $2a$ is maintained in the vicinity of the highest temperature. On the other hand, when the temperature of the thermal conductor 1 is near its lowest temperature, the first thermal flow switch $15a$ is located at its OFF-position and the second thermal flow switch $15b$ is located at its ON-position and thereby, heat transfer is caused between the thermal conductor 1 and the second thermal accumulator $2b$ and the temperature of the second thermal accumulator $2b$ is maintained in the vicinity of the lowest temperature. Consequently, electric energy is generated through the thermoelectric conversion unit 3 by the temperature difference caused between the first and second thermal accumulators $2a$, $2b$.

Thus the temperature difference is maintained near the temperature difference between the highest and lowest temperatures over a 24-hour period (a full cycle of the change of temperature) and a lot of electric power can be generated stably by using the temperature difference. In this case, it is possible to continuously generate electric power by means of thermal energy stored in a pair of the thermal accumulators $2a$, $2b$ and thereby, it is possible to remove a secondary battery required for stable continuous electric power generation in a thermoelectric generator with a single thermal accumulator.

Although not shown in the figures, when electric power is intermittently supplied to an electric load or when electric power is supplied to a small electric load through a secondary battery, preferably, a third thermal flow switch is arranged in series with the thermoelectric conversion unit 3 so as to minimize leak of heat through the thermoelectric conversion unit 3 which is not used for electric power generation so that the stored thermal energy is effectively utilized. This is applicable to other embodiments.

Figure 14:
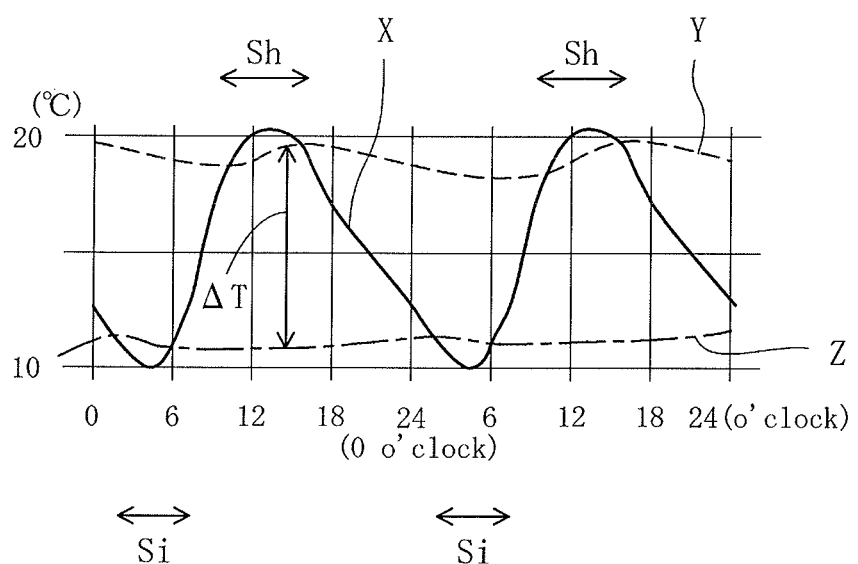
FIG. 14 is a graph similar to the graph of FIG. 2, illustrating an example of the change of temperature of the thermal conductor and the first and second thermal accumulators of the thermoelectric generator shown in FIG. 13 when arranged at the inside of outdoor air.

FIG. 14 is a graph similar to the graph of FIG. 2, illustrating an example of the change of temperature of the thermal conductor 1 and the first and second thermal accumulators 2a, 2b of the thermoelectric generator shown in FIG. 13 when arranged at the inside of outdoor air. In the graph of FIG. 14, a vertical axis represents temperature (° C.), a horizontal axis represents time (o'clock), curves X, Y and Z represent the change of temperature of the thermal conductor 1, the change of temperature of the first thermal accumulator and the change of temperature of the second thermal accumulator 2b, respectively. Further, in the graph of FIG. 14, a symbol "Sh" designates a period during the first and second thermal flow switches 15a, 15b are located at the ON-position and the OFF-position, respectively, and a symbol "Si" designates a period during the first and second thermal flow switches 15a, 15b are located at the OFF-position and the ON-position, respectively.

As is obvious from the graph of FIG. 14, the temperature of the thermal conductor 1 increases and decreases within the temperature range of about 10° C. with a change of temperature of atmosphere temperature. On the other hand, under ideal condition that thermal resistance of the covering layer 4 is infinite and the thermoelectric conversion unit 3 generates electric power without heat transfer, the temperatures of the first and second thermal accumulators 2a, 2b are maintained near the highest and lowest temperatures of the thermal conductor 1, respectively.

However, actually, heat leaks from the covering layer 4 because the covering layer 4 has finite thermal resistance, and heat transfer is accompanied by electric power generation of the thermoelectric conversion unit 3, so that the temperature Y of the first thermal accumulator 2a changes within the temperature range lower than the highest temperature of the thermal conductor 1 and the temperature Z of the second thermal accumulator 2b changes within the temperature range higher than the lowest temperature of the thermal conductor 1. As a result, the temperature difference $\Delta T$ changes within the temperature range narrower than the temperature difference between the highest and lowest temperatures of the thermal conductor 1. (about 10° C.).

Therefore, taking into account the leak of heat from the covering layer 4 and the heat transfer accompanied by electric power generation of the thermoelectric conversion unit 3, the thermal capacity of the first and second thermal accumulators 2a, 2b is set such that the temperatures of the first and second thermal accumulators 2a, 2b can change within the range of about 2° C. and thereby, the temperature difference $\Delta t$ of about 8° C. between the first and second thermal accumulators 2a, 2b available for actual electric power generation through the use of a change of atmospheric temperature of a day can be obtained stably. Thus electric power is generated by the temperature difference $\Delta t$ and a value of integral thereof over 24 hours corresponds to electric power energy of one cycle (one cycle of days and nights).

The thermoelectric generator provided with two thermal accumulators can generate electric voltage, which is nearly twice as much as electric voltage generated by a thermoelectric generator with a single thermal accumulator, continuously over a 24-hour period nearly. In this case, the thermoelectric generator with a single thermal accumulator generates electric voltage intermittently and changes the output voltage with time. That is to say, the electric power generated by the thermoelectric generator with two thermal accumulators generates is over 20 times more than that of the thermoelectric generator with a single thermal accumulator.

In the thermoelectric generator shown in FIG. 13, immediately after manufacturing the thermoelectric generator, or in the case of keeping the thermoelectric generator under constant temperature over a long duration, because there is no temperature difference between the first and second thermal accumulators 2a, 2b and the thermoelectric generator stops, it is a matter how to start the thermoelectric generator.

According to one of methods for starting such thermoelectric generator, as the first thermal flow switch 15a, a thermal flow switch designed to be in on-state whenever it is in an initial position or is not controlled (b-contact of an electric circuit) is used, and as the second thermal flow switch 15b, a thermal flow switch designed to be in off-state whenever it is in an initial position or is not controlled (a-contact of an electric circuit) is used. According to this method, at the same time as the thermoelectric generator is arranged in an environment whose temperature changes, the temperature of the first thermal accumulator 2a changes corresponding to a change of temperature of the thermal conductor 1 on the one hand, and the temperature of the second thermal accumulator 2b is maintained near its initial temperature on the other hand. Thus, as the temperature of the environment approaches its highest temperature, a temperature difference is caused between the first and second thermal accumulators 2a, 2b so that the thermoelectric conversion unit 3 generates electric voltage and the electric voltage is supplied to the thermal flow switch controller 22 so as to activate the thermal flow switch controller 22.

When the temperature of the thermal conductor 1 is near its highest temperature or higher than that of the first thermal accumulator 2a, the first thermal flow switch 15a is located at its On-position by the thermal flow switch controller 22. When the temperature of the thermal conductor 1 is near its lowest temperature or lower than that of the second thermal accumulator 2b, the second thermal flow switch 15b is located at its ON-position by the thermal flow switch controller 22. As a result, the temperature of the first thermal accumulator 2a approaches the highest temperature of the thermal conductor 1 while the temperature of the second thermal accumulator 2b approaches the lowest temperature of the thermal conductor 1 and so, the thermoelectric generator is automatically started.

According to another method for starting the thermoelectric generator, a third thermoelectric conversion unit is arranged between the thermal conductor 1 and the first or second thermal accumulators 2a, 2b, and as the first and second thermal flow switches 15a, 15b, a thermal flow switch designed to be in off-state whenever it is in an initial position or is not controlled (a-contact of an electric circuit) is used. According to this method, at the same time as the thermoelectric generator is arranged in an environment whose temperature changes, the temperature of the thermal conductor 1 changes corresponding to a change of temperature of the environment on the one hand, and the temperatures of the first and second thermal accumulators 2a, 2b are maintained near their initial temperature on the other hand. Thus a temperature difference between the first and second thermal accumulators 2a, 2b is increased with time. When the temperature difference reaches a certain level, the thermoelectric conversion unit 3 generates electric voltage and the electric voltage is supplied to the thermal flow switch controller 22 so as to activate the thermal flow switch controller 22.

According to a further embodiment of the present invention, in the configuration shown in FIG. 13, additionally, a first Peltier element is arranged between the first thermal flow switch 15a and the first thermal accumulator 2a in such a manner that the first Peltier element contacts with the first thermal flow switch 15a at its one side and the first thermal accumulator 2a at its other side. Further, a second Peltier element is arranged between the second thermal flow switch 15b and the second thermal accumulator 2b is such a manner that the second Peltier element contacts with the second thermal flow switch 15b at its one side and the second thermal accumulator 2b at its other side.

According to this embodiment, when the first thermal flow switch 15a is located at its ON-position, the first Peltier element produces heat at its one side and absorbs heat at its other side. On the other hand, when the second thermal flow switch 15b is located at its ON-position, the second Peltier element produces heat at its one side and absorbs heat at its other side. Consequently, the first thermal accumulator 2a whose temperature is near the highest temperature of the thermal conductor 1 is further heated while the second thermal accumulator 2b whose temperature is near the lowest temperature of the thermal conductor 1 is further cooled and thereby, the temperature difference Δt is further increased.

In the above-mentioned embodiment, a thermoelectric conversion module based on Seebeck effect consisting of a semiconductor made from bismuth and tellurium and so on is used as the thermoelectric conversion unit, and the power generation efficiency of such kind of thermoelectric conversion modules is only several percent through several dozen percent. Therefore, in the above-mentioned embodiment, the power generation efficiency of the thermoelectric conversion module is assumed to be about 5 percent. On the other hand, thermoelectric conversion modules based on spin Seebeck effect and thermoelectric conversion modules based on Seebeck effect made of for example, clathrate compounds referred as rattling may improve the power generation efficiency dramatically because they are made of magnetic insulators and compounds whose thermal resistance is considerably large and they cause less leak of heat. The thermoelectric generator comprising the thermoelectric conversion module based on Seebeck effect can generate electric energy of 1 mWh to several dozen Wh, while the thermoelectric generator comprising the thermoelectric conversion module based on spin Seebeck effect can generate electric energy more than several hundred Wh.

Figure 15:
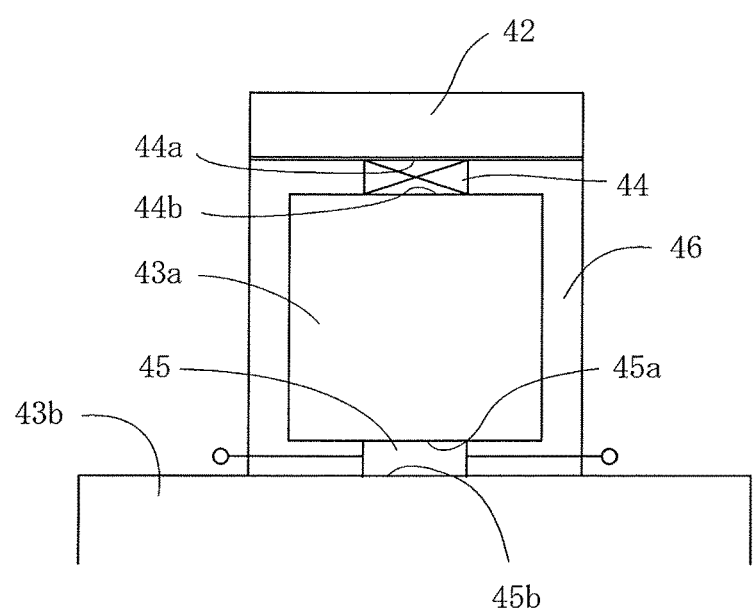
FIG. 15 is a longitudinal sectional view of a thermoelectric generator according to a further embodiment of the present invention.

FIG. 15 is a longitudinal sectional view of a thermoelectric generator according to a further embodiment of the present invention. Referring to FIG. 15, in this embodiment, the thermoelectric generator comprises a single thermal conductor 42, and first and second thermal accumulators 43a, 43b. The second thermal accumulator 43b consists of a construction at which the thermoelectric generator is arranged. The construction is, for example, a mechanical appliance or a building or a buoy floating on the sea, a river and a lake or a heat-exchange equipment exchanging heat with the ground having almost constant temperature throughout the year.

The thermoelectric generator also comprises at least one thermal flow control unit 44 (in this embodiment, one thermal flow control unit) arranged between the thermal conductor 42 and the first thermal accumulator 43a in such a way that the thermal flow control unit 44 contact with the thermal conductor 42 at its one side and the first accumulator 43a with its other side. The thermal flow control unit 44 consists of a thermal flow switch moving between an ON-position in which the thermal flow switch contacts with both the thermal conductor 42 and the first thermal accumulator 43a to effect heat transfer between the thermal conductor 42 and the first thermal accumulator 43a through the thermal flow switch and an OFF-position in which the thermal flow switch separates from at least one of the pair of the thermal conductor 42 and the first thermal accumulator 43a to stop the heat transfer.

At least one thermoelectric conversion unit 45 (in this embodiment, one thermoelectric conversion unit) is arranged between the first thermal accumulator 43a and the construction 43b so as to contact with the first thermal accumulator 43a at its one side and the construction 43b at its other side. The first thermal accumulator 43a is covered by a covering layer 46 except the areas contacting with the thermal flow switch 44 and the thermoelectric conversion unit 45.

Although not shown in the figure, the thermoelectric generator further comprises a first temperature sensor detecting temperature of the thermal conductor 42, a second temperature sensor detecting temperature of the first thermal accumulator 43a, a third temperature sensor detecting temperature of the construction 43b, and a thermal switch controller switching the ON-position and the OFF-position of the thermal flow switch based on detection signals of the first through third temperature sensors. Thus electric energy is generated from the thermoelectric conversion unit 45 by the temperature difference caused between the first thermal accumulator 43a and the structure 43b.

Figure 16:
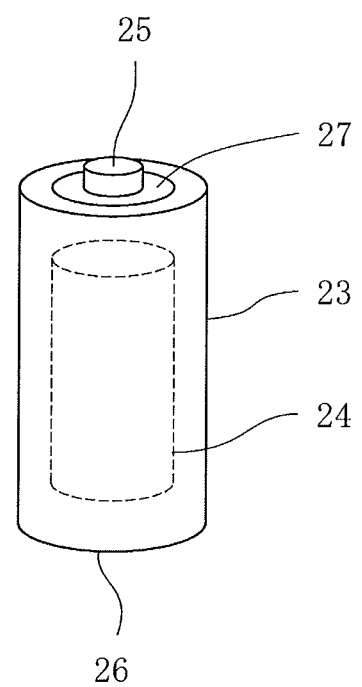
FIG. 16 is a perspective view of a thermoelectric generator according to a further embodiment of the present invention.

FIG. 16 is a perspective view of a thermoelectric generator according to a further embodiment of the present invention. In this embodiment, the thermoelectric generator shown in FIG. 1 is in the form of a fry cell battery commercially available. For clarity, all of the structural elements except the thermal conductor and the thermal accumulator of the thermoelectric generator are omitted in FIG. 16. In FIG. 16, the reference numerals 23 and 24 designate the thermal conductor and the thermal accumulator, respectively. Positive and negative electrodes 25, 26 of the dry cell battery consist of a pair of electrodes of the thermoelectric conversion unit (FIG. 1) or output terminals of a secondary battery if the thermoelectric generator is provided with the secondary battery (FIG. 4). The negative electrode 26 may form a part of the thermal conductor 23. The positive electrode 25 is electrically insulated from the thermal conductor 23 by an insulating portion 27.

Figure 17:
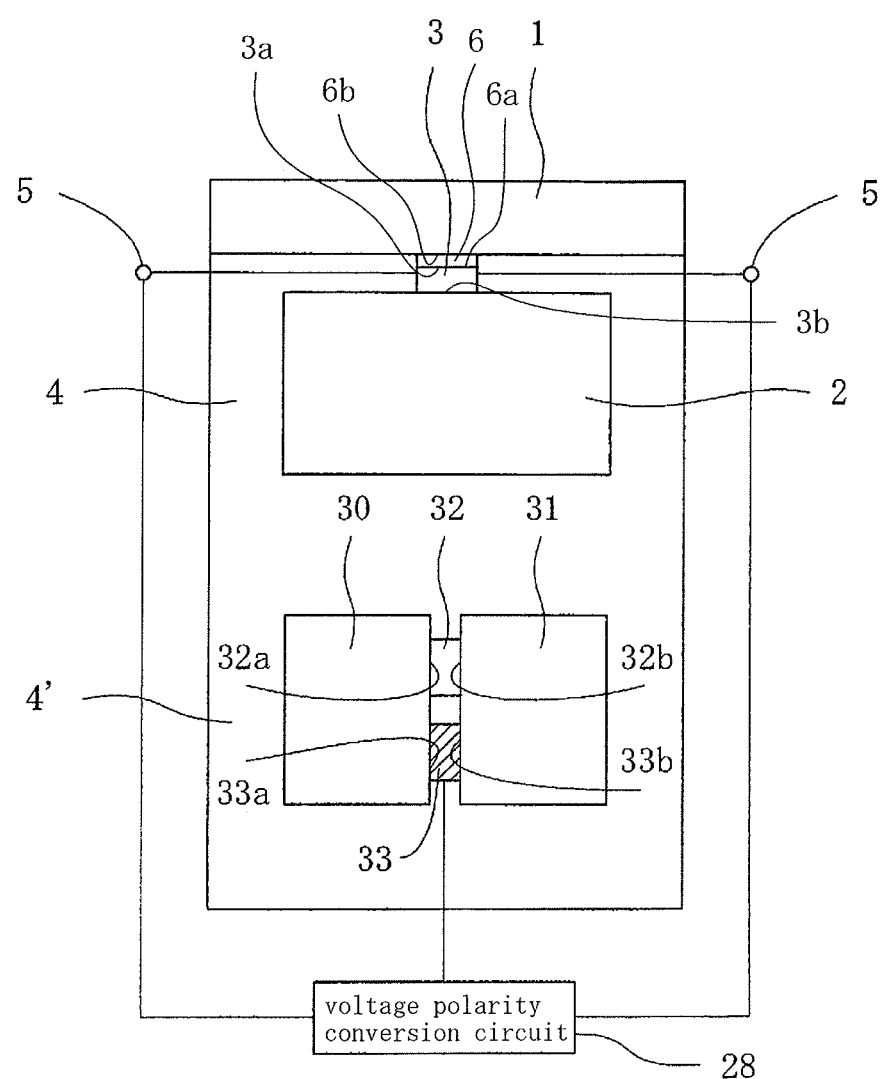
FIG. 17 is a longitudinal sectional view of a thermoelectric generator according to a further embodiment of the present invention.

FIG. 17 a longitudinal sectional view of a thermoelectric generator according to a further embodiment of the present invention. Referring to FIG. 17, in this embodiment, a thermoelectric generator comprises, in addition to the features of the embodiment shown in FIG. 1, a first additional thermal accumulator 30, a second additional thermal accumulator 31, an additional thermoelectric conversion unit 32 (whose electrode pair is not shown) arranged between the first and second additional thermal accumulators 30, 31 in such a way that the additional thermoelectric conversion unit 32 contacts with the first additional thermal accumulator 30 at one side thereof 32a and the second additional thermal accumulator 31 at the other side thereof 32b. The thermoelectric generator further comprises an additional Peltier element 33 arranged between the first and second additional thermal accumulator 30, 31 in such a way that the additional Peltier element 33 contacts with the first additional accumulator 30 at one side thereof 33a and the second additional thermal accumulator 31 at the other side thereof 33b, and an additional covering layer 4' having a thermal insulating property and covering the first and second additional thermal accumulators 30, 31 except the areas thereof contacting the additional thermoelectric conversion unit 32 and the additional Peltier element 33.

In this case, the first and second additional thermal accumulators 30, 31, the additional thermoelectric conversion unit 32, the additional Peltier element 33 and the additional covering layer 4' are integrated with the rest of the thermoelectric generator as shown in FIG. 17, or formed as a portion separated from the rest of the thermoelectric generator. In the latter case, the portions and the rest of the thermoelectric generator are connected with each other by a cable.

Thus electric energy outputted by the thermoelectric conversion unit 3 except the additional thermoelectric conversion unit 32 is applied to the additional Peltier element 33 through for example, a voltage polarity conversion circuit 28 and thereby, one of the first and second additional thermal accumulators 30, 31 is heated and the other of them is cooled by the additional Peltier element 33. Consequently, temperature difference is caused between the first and second additional thermal accumulators 30, 31, and electric energy is generated from the additional thermoelectric conversion unit 32 by the temperature difference.

According to this embodiment, the temperature of the thermal conductor 2 changes only within the range of change of temperature of the environment while the range of change of temperatures of the first and second additional thermal accumulators 30, 31 is not subject to such limitation, so that a large temperature difference is caused between the first and second additional thermal accumulators 30, 31 and a lot of electric energy is generated from the additional thermoelectric conversion unit 32 when needed.

In this embodiment, when an electronic device, which receives electricity supply from the thermoelectric generator, operates intermittently and accordingly, intermittent output of electricity from the thermoelectric generator is permitted, the additional Peltier element 33 may be removed and the additional thermoelectric conversion unit 32 may be composed of a Seebeck element. In this case, the additional thermoelectric conversion unit 32 functions as the Seebeck element so as to generate electric energy when the electricity is outputted from the thermoelectric generator. On the other hand, when the electricity is not outputted from the thermoelectric generator, electric energy outputted from the thermoelectric conversion unit 3 is applied to the additional thermoelectric conversion unit 32 through for example, a voltage polarity conversion circuit 28 so that the additional thermoelectric conversion unit 32 functions as a Peltier element so as to conduct accumulation of heat. When required for intermittent electric power generation, another thermal flow switch is arranged in series with the thermoelectric conversion unit so as to minimize useless heat transfer from the thermal accumulators which fails to contribute to electric power generation.

Figure 18:
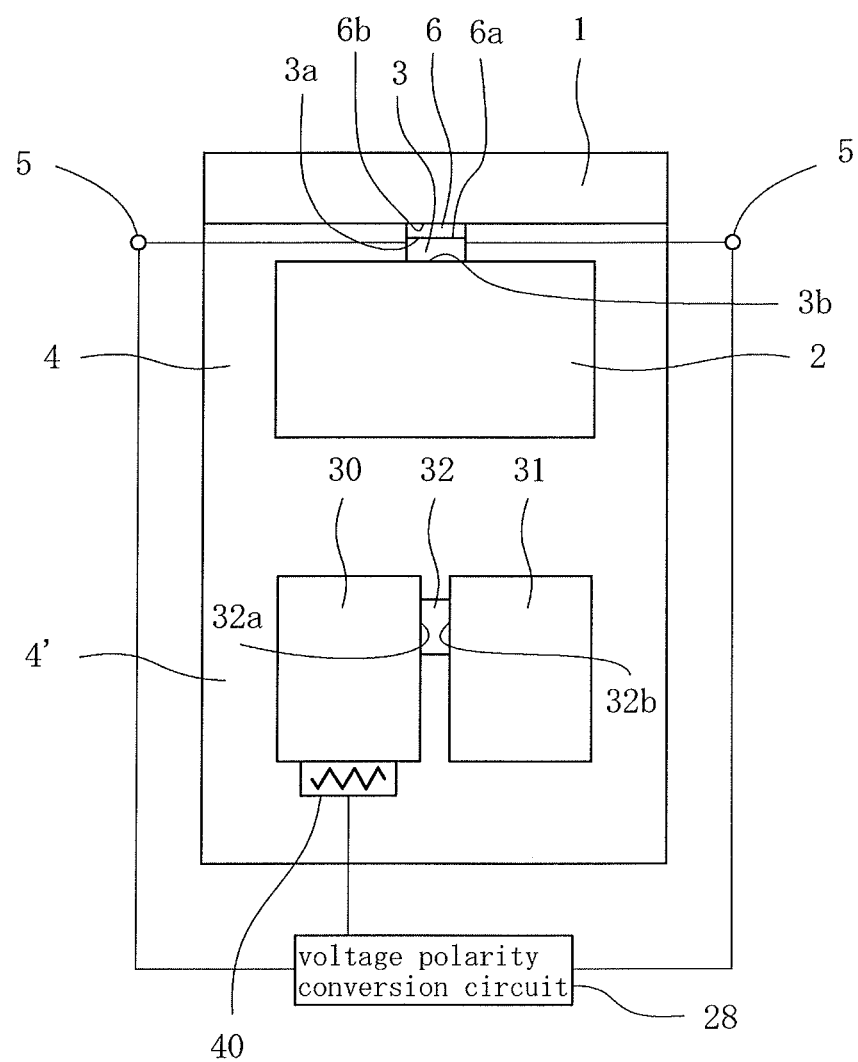
FIG. 18 is a longitudinal sectional view of a thermoelectric generator according to a further embodiment of the present invention.

FIG. 18 is a longitudinal sectional view of a thermoelectric generator according to a further embodiment of the present invention. As is obvious from FIG. 18, this embodiment is different from the embodiment shown in FIG. 17 in arranging a heater 40 in contact with the first additional thermal accumulator 30 in place of the Peltier element 33. According to this embodiment, electric energy outputted from the thermoelectric conversion unit 3 except the additional thermoelectric conversion unit 32 is applied to the heater 40 through for example, the voltage polarity conversion circuit 28 and the first additional thermal accumulator 30 is heated by the heater 40. As a result, the temperature of the first additional thermal accumulator 30 is higher than both that of the rest of the thermoelectric generator and the temperature near the midpoint of the range of change of temperature of the environment on the one hand, and the temperature of the second additional thermal accumulator 31 is maintained near the intermediate temperature on the other hand. Consequently, the temperature difference is caused between the first and second additional thermal accumulators 30, 31 and electric energy is generated from the additional thermoelectric conversion unit 32 by the temperature difference.

Figure 19:
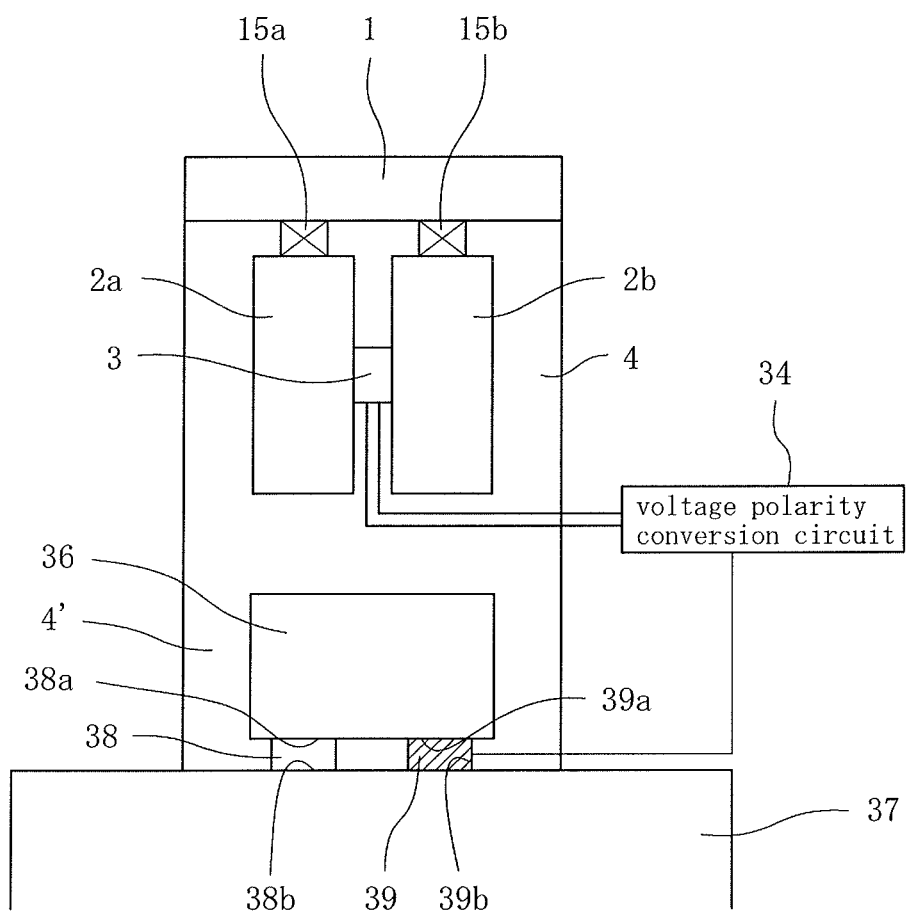
FIG. 19 is a longitudinal sectional view of a thermoelectric generator according to a further embodiment of the present invention.

FIG. 19 a longitudinal sectional view of a thermoelectric generator according to a further embodiment of the present invention. Referring to FIG. 19, in this embodiment, a thermoelectric generator comprises, in addition to the features of the embodiment shown in FIG. 10 (for clarity, in FIG. 19, the first through third temperature sensors and the thermal flow switch controller is omitted), a first additional thermal accumulator 36, a second additional thermal accumulator 37, an additional thermoelectric conversion unit 38 (whose electrode pair is not shown) arranged between the first and second additional thermal accumulators 36, 37 in such a way that the additional thermoelectric conversion unit 38 contacts with the first additional thermal accumulator 36 at its one side 38a and the second additional thermal accumulator 37 at its other side 38b. The thermoelectric generator also comprises an additional Peltier element 39 arranged between the first and second additional thermal accumulators 36, 37 in such a way that the additional Peltier element 39 contacts with the first additional thermal accumulator 36 at its one side 39a and the second additional thermal accumulator 37 at its other side 39b. The second additional thermal accumulator 37 is a construction at which the thermoelectric generator is arranged.

The thermoelectric generator further comprises an additional covering layer 4' having a thermal insulating property and covering the first additional thermal accumulator 36 except the area thereof contacting with the additional thermoelectric conversion unit 38 and the additional Peltier element 39. In this case, in order to protect the other side 38b of the additional thermoelectric conversion unit 38 and the other side 39b of the additional Peltier element 39, an additional thermal conductor is arranged between the second additional thermal accumulator 37 and either of the additional thermoelectric conversion unit 38 and the additional Peltier element 39, if necessary.

Thus electric energy outputted by the thermoelectric conversion unit 3 except the additional thermoelectric conversion unit 38 is applied to the additional Peltier element 39 through for example, a voltage polarity conversion circuit 34 and thereby, one of the first and second additional thermal accumulators 36, 37 is heated and the other of them is cooled by the additional Peltier element 39. Consequently, temperature difference is caused between the first and second additional thermal accumulators 36, 37, and electric energy is generated from the additional thermoelectric conversion unit 38 by the temperature difference.

In this embodiment, when an electronic device, which receives electricity supply from the thermoelectric generator, operates intermittently and accordingly, intermittent output of electricity from the thermoelectric generator is permitted, the additional Peltier element 39 may be removed and the additional thermoelectric conversion unit 32 may be composed of a Seebeck element. In this case, the additional thermoelectric conversion unit 38 functions as the Seebeck element so as to generate electric energy when the electricity is outputted from the thermoelectric generator. On the other hand, when the electricity is not outputted from the thermoelectric generator, electric energy outputted from the thermoelectric conversion unit 3 is applied to the additional thermoelectric conversion unit 38 through for example, a voltage polarity conversion circuit 34 so that the additional thermoelectric conversion unit 38 functions as a Peltier element so as to conduct accumulation of heat.

Figure 20:
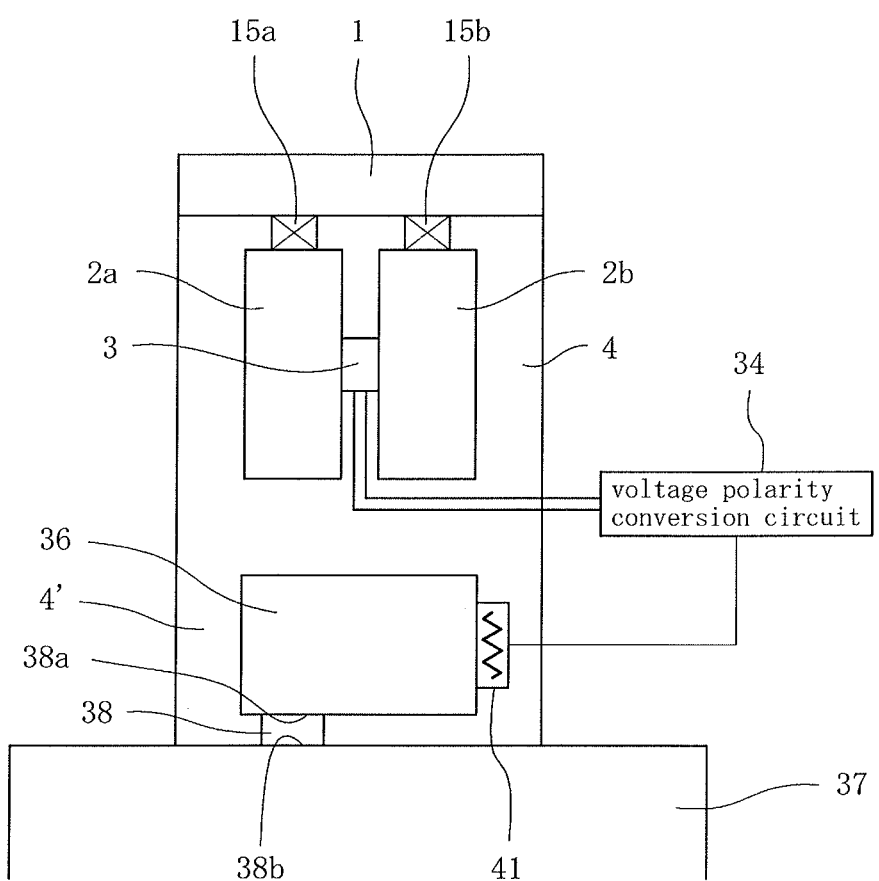
FIG. 20 is a longitudinal sectional view of a thermoelectric generator according to a further embodiment of the present invention.

FIG. 20 is a longitudinal sectional view of a thermoelectric generator according to a further embodiment of the present invention. As is obvious from FIG. 20, this embodiment is different from the embodiment shown in FIG. 18 in arranging a heater 41 in contact with the first additional thermal accumulator 36 in place of the Peltier element 39. According to this embodiment, electric energy outputted from the thermoelectric conversion unit 3 except the additional thermoelectric conversion unit 38 is applied to the heater 41 through for example, the voltage polarity conversion circuit 34 and the first additional thermal accumulator 36 is heated by the heater 41. As a result, the temperature of the first additional thermal accumulator 36 is higher than both that of the rest of the thermoelectric generator and the temperature near the midpoint of the range of change of temperature of the environment on the one hand, and the temperature of the second additional thermal accumulator 37 is maintained near the intermediate temperature on the other hand because the second thermal accumulator 37 is the structure having large thermal conductivity. Consequently, the temperature difference is caused between the first and second additional thermal accumulators 36, 37 and electric energy is generated from the additional thermoelectric conversion unit 38 by the temperature difference.

According to a further embodiment of the present invention, at least one of the thermal accumulators is made of latent heat storage means. By using the latent heat storage means, it is possible to provide a thermoelectric generator having a compact structure and high electric generating capacity.

Figure 21:
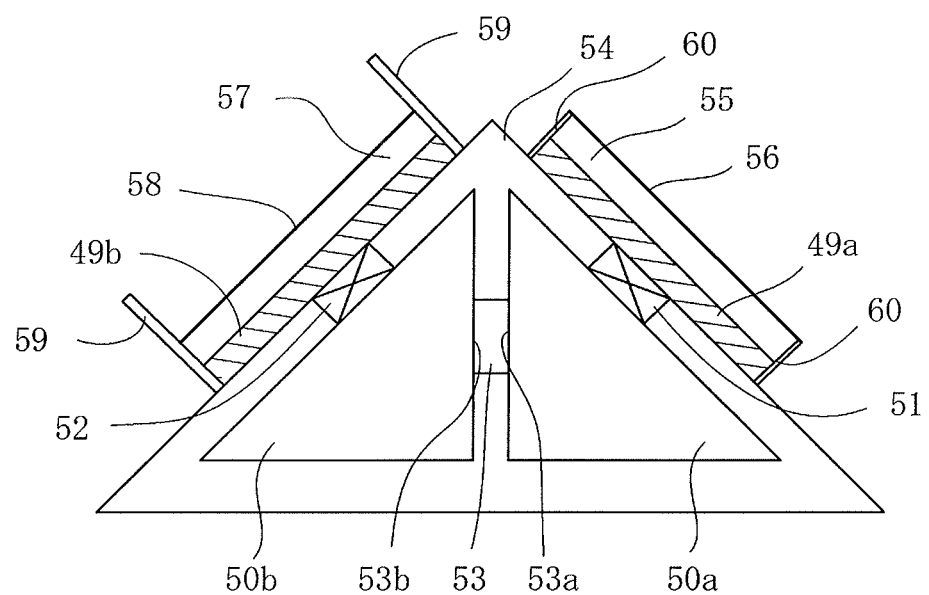
FIG. 21 is a longitudinal sectional view of a thermoelectric generator according to a further embodiment of the present invention.

FIG. 21 a longitudinal sectional view of a thermoelectric generator according to a further embodiment of the present invention. This thermoelectric generator is adapted for installing in outdoor air. Referring to FIG. 21, the thermoelectric generator comprises first and second thermal conductors 49a, 49b, first and second thermal accumulators 50a, 50b, at least one first thermal flow control unit (in this embodiment, one first thermal flow control unit) arranged between the first thermal conductor 49a and the first thermal accumulator 50a, and at least one second thermal flow control unit (in this embodiment, one second thermal flow control unit) arranged between the second thermal conductor 49b and the second thermal accumulator 50b.

The first thermal flow control unit is a first thermal flow switch 51 moving between an ON-position in which the first thermal flow switch 51 contacts with both the first thermal conductor 49a and the first thermal accumulator 50a to effect heat transfer between the first thermal conductor 49a and the first thermal accumulator 50a through the first thermal flow switch 51 and an OFF-position in which the first thermal flow switch 51 separates from at least one of the pair of the first thermal conductor 49a and the first thermal accumulator 50a to stop the heat transfer. The second thermal flow control unit is a second thermal flow switch 52 moving between an ON-position in which the second thermal flow switch 52 contacts with both the second thermal conductor 49b and the second thermal accumulator 50b to effect heat transfer between the second thermal conductor 49b and the second thermal accumulator 50b through the second thermal flow switch 52 and an OFF-position in which the second thermal flow switch 52 separates from at least one of the pair of the second thermal conductor 49b and the second thermal accumulator 50b to stop the heat transfer The thermoelectric generator also comprises at least one thermoelectric conversion unit (in this embodiment, one thermoelectric conversion unit) 53 arranged between the first and second thermal accumulators 50a, 50b in such a way that the thermoelectric conversion unit 53 contacts with the first thermal accumulator 50a at its one side 53a and the second thermal accumulator 50b at its other side 53b. The first and second thermal accumulators 50a, 50b are covered by a covering layer 54 except the areas thereof contacting with the first and second thermal flow switches 51, 52 and the thermoelectric conversion unit 53. The covering layer 54 has a thermal insulating property.

Furthermore, a wall 60 having a thermal insulating property is formed on the covering layer 54 to surround the first thermal conductor 49a. The top end surface of the wall 60 extends upwardly over the first thermal conductor 49a and a filter 56 is attached to the top end surface. The filter 56 transmits solar light except far-infrared radiation. Thus the whole of surface of the first thermal conductor 49a is covered by the filter 56 through a layer of air 55.

A shade 59 having a thermal insulating property is fixed on the covering layer 54 to surround the second thermal conductor 49b. The shade 59 functions to prevent the second thermal conductor 49b from being subjected to direct sunlight during the day. Another filter 58 for blocking sunlight except far-infrared radiation is attached to the shade 56 and spaced from the surface of the second thermal conductor 49b. Thus the whole of surface of the second thermal conductor 49b is covered by the filter 58 through a layer of air 57.

Although not shown in the figure, the thermoelectric generator further comprises a first temperature sensor detecting temperature of the first thermal conductor 49a, a second temperature sensor detecting temperature of the first thermal accumulator 50a, a third temperature sensor detecting temperature of the second thermal conductor 49b, a fourth temperature sensor detecting temperature of the second thermal accumulator 50b, and a thermal flow switch controller switching the ON-positions and the OFF-positions of the first and second thermal flow switches 51, 52 based on detection signals of the first through fourth temperature sensors.

The thermoelectric generator is arranged in outdoor air in such a way that the first thermal conductor 49a receives direct sunlight on the one hand and the second thermal conductor 49b does not receive direct sunlight on the other hand. Consequently, the first thermal conductor 49a effectively absorbs heat during the day and has less incidence of radiative cooling during the night so that the temperature of the first thermal conductor 49a is maintained at high temperature throughout the day. On the other hand, the second thermal conductor 49b is hard to absorb heat during the day and subjected to radiative cooling effectively during the night so that the temperature of the second thermal conductor 49b is maintained at low temperature throughout the day. Correspondingly, the first and second thermal flow switches 51, 52 are controlled by the thermal flow switch controller.

In this embodiment, the thermoelectric generator operates as follows: When the thermoelectric generator is installed in an outdoor location, the electric power generation is not carried out until a certain temperature difference is caused between the first and second thermal accumulators 49a, 49b by storing a certain amount of heat in them. After the amount of heat is stored in the first and second thermal accumulators 49a, 49b, the electric power generation is carried out by generating electric energy from the thermoelectric conversion unit 53 by use of a temperature difference caused by heat newly stored in the first and second thermal accumulators 49a, 49b.

The thermoelectric generator according to the present invention can be applied to not only a power source of an electronic device but also other uses. For example, it is possible to use the thermoelectric generator of the present invention as a solar thermal electric generation system for supply of home electric power by enlarging the size of the thermoelectric generator or arranging a plurality of the thermoelectric generators. When the thermoelectric generator of the present invention is attached to a satellite in such a way that the thermal conductor of the thermoelectric generator is arranged on a body of the satellite and the thermal accumulator covered with the covering layer is arranged inside the satellite, the thermal conductor is subjected to and shaded from sunlight periodically with rotational movement of the satellite. In this case, the temperature of the thermal accumulator is maintained near the intermediate temperature between the highest and lowest temperatures of the thermal conductor by setting a thermal time constant of the thermal accumulator to be longer than a period of the rotational movement and thereby, a stable electric power generation can be achieved.

The thermoelectric generator according to the present invention can operates a fault detection sensor by installing the thermoelectric generator on a place of a mechanical equipment which is subjected to high temperature in the event of a failure in such a manner that the thermoelectric generator generates electric power to supply it to the sensor only when the failure occurs in the mechanical equipment. In this configuration, a secondary battery is not needed because it is not necessary to store the generated electric energy. In addition, the thermoelectric generator according to the present invention can be used as a power source of a clinical thermometer. In this case, the thermoelectric generator is kept at room temperature during non-use of the thermometer and the thermoelectric generator is activated to generate electric energy by bringing the thermal conductor into contact with user's body and the thermometer starts operation. In this configuration, a secondary battery is not also needed.

DESCRIPTION OF REFERENCE NUMERALS 1, 1' Thermal conductor
2 Thermal accumulator
3 Thermoelectric conversion unit
3a One side
3b The other side
4 Covering layer
4' Additional covering layer
4a Opening
5 Electrode
6 Thermal flow control unit
6a One side
6b The other side
7a Thermal accumulator in the form of liquid
7b Container
8 Fin for heat exchange
9 Opening
10 Power source section
11 Voltage polarity conversion circuit
12 Secondary battery
13 Electronic device
14 Auxiliary thermal conduction unit
14a Bimetal
14b Heat-shrinkable material
15 Thermal flow switch
15a First thermal flow switch
15b Second thermal flow switch
16 First temperature sensor
17 Second temperature sensor
18 Thermal flow switch controller
19 First temperature sensor
20 Second temperature sensor
21 Third temperature sensor
22 Thermal flow switch controller
23 Thermal conductor
24 Thermal accumulator
25 Positive electrode
26 Negative electrode
27 Insulating portion
28 Voltage polarity conversion circuit
29a Linear actuator
29b Movable thermal conductive block
29c Rotary actuator
29d Movable thermal conductive block
30 First additional thermal accumulator
31 Second additional thermal accumulator
32a One side
32b The other side
33 Additional Peltier element
33a One side
33b The other side
34 Voltage polarity conversion circuit
36 First additional thermal accumulator
37 Second additional thermal accumulator
38 Additional thermoelectric conversion unit
38a One side
38b The other side
39 Additional Peltier element
39a One side
39b The other side
40, 41 Heater
42 Thermal conductor
43a First thermal accumulator
43b Second thermal accumulator
44 Thermal flow switch
44a One side
44b The other side
45 Thermoelectric conversion unit
45a One side
45b The other side
46 Covering layer
47 Container
48a-48c latent heat storage means
49a First thermal conductor
49b Second thermal conductor
50a First thermal accumulator
50b Second thermal accumulator
51 First thermal flow switch
52 Second thermal flow switch
53 Thermoelectric conversion unit
53a One side
53b The other side
54 Covering layer 55 Layer of air
56 Filter
57 Layer of air
59 Filter
59 Shade
60 Wall

The invention claimed is:

1. A thermoelectric generator for generating electrical energy in response to periodic temperature changes in an environment in which the thermoelectric generator is installed, the thermoelectric generator comprising:

at least one thermal conductor arranged in a thermal exchange relationship with the environment, and having a first temperature that changes in response to the periodic temperature changes in the environment;

a first temperature sensor arranged in thermal communication with the at least one thermal conductor to detect the first temperature;

at least one thermal accumulator having a thermal storage medium arranged in a thermal exchange relationship with the at least one thermal conductor, and having a second temperature that changes in response to the first temperature;

a second temperature sensor arranged in thermal communication with the at least one thermal accumulator to detect the second temperature;

a thermally, insulating covering layer arranged to cover the at least one thermal accumulator to reduce thermal loss from the storage medium;

at least one thermoelectric conversion unit arranged in a thermal exchange relationship between at least one pair of thermal constituents selected from a group consisting of at least one pair of the at least one thermal conductor and the at least one thermal accumulator, and at least one pair of the at least one thermal accumulator and another thermal accumulator, to generate the electrical energy in response to a difference between the first temperature and the second temperature, the at least one thermoelectric conversion unit having a pair of electrodes from which the electrical energy is output from the thermoelectric generator;

at least one thermal flow switch arranged between the at least one pair of thermal constituents selected from a group consisting of the at least one pair of the at least one thermal conductor and the at least one thermal accumulator, the at least one pair of the at least one thermal accumulator and the other thermal accumulator, at least one pair of the at least one thermal conductor and the at least one thermoelectric conversion unit, and at least one pair of the at least one thermal accumulator and the at least one thermoelectric conversion unit, to control the thermal exchange between the selected pair of thermal constituents, the at least one thermal flow switch having a contact part, and an actuator part arranged to move the contact part between an on-position in which the contact part is simultaneously positioned in direct, physical, thermal and surface contact with both of the selected pair of thermal constituents to effect thermal exchange between the selected pair of thermal constituents, and an off-position in which the contact part is simultaneously positioned out of direct, physical, thermal and surface contact with both of the selected pair of thermal constituents to prevent thermal exchange between the selected pair of thermal constituents; and a thermal flow switch controller connected to the first and second temperature sensors and to the at least one thermal flow switch, and arranged to control the actuator part to move the contact part to the off-position when the difference between the first temperature and the second temperature is below a predetermined temperature value, and to move the contact part to the on-position when the difference between the first temperature and the second temperature is at least equal to the predetermined temperature value.

2. The thermoelectric generator according to claim 1, wherein the at least one thermal conductor is a single thermal conductor; wherein the at least one thermal accumulator is a single thermal accumulator; and wherein the at least one thermoelectric conversion unit is a single thermoelectric conversion unit, and has one side in surface area thermal contact with the single thermal conductor, and an opposite side in surface area thermal contact with the single thermal accumulator.

3. The thermoelectric generator according to claim 1, wherein the at least one thermal accumulator has an outer surface on which the at least one thermoelectric conversion unit and the at least one thermal flow switch are mounted; and wherein the thermally insulating covering layer is arranged to entirely cover the outer surface, except where the at least one thermoelectric conversion unit and the at least one thermal flow switch are mounted.

4. The thermoelectric generator according to claim 3, wherein the at least one thermal conductor is mounted on the thermally insulating covering layer on top of the at least one thermoelectric conversion unit and the at least one thermal flow switch.

5. The thermoelectric generator according to claim 1, wherein the contact part is a thermally conductive block, and wherein the actuator part is a linear actuator having a rod on which the thermally conductive block is mounted.

6. The thermoelectric generator according to claim 5, wherein the thermally conductive block is constituted of an elastic material.

7. The thermoelectric generator according to claim 1, wherein the at least one thermal conductor exchanges thermal energy solely with the environment.

* * * * *